United States Patent
Sudo et al.

(10) Patent No.: US 10,998,907 B2
(45) Date of Patent: *May 4, 2021

(54) INTEGRATED CIRCUIT DEVICE, OSCILLATOR, ELECTRONIC DEVICE, AND VEHICLE

(71) Applicant: Seiko Epson Corporation, Tokyo (JP)

(72) Inventors: Yasuhiro Sudo, Chino (JP); Hideo Haneda, Matsumoto (JP)

(73) Assignee: Seiko Epson Corporation (JP)

( * ) Notice: Subject to any disclaimer, the term of this patent is extended or adjusted under 35 U.S.C. 154(b) by 165 days.

This patent is subject to a terminal disclaimer.

(21) Appl. No.: 16/257,492

(22) Filed: Jan. 25, 2019

(65) Prior Publication Data
US 2019/0238138 A1    Aug. 1, 2019

(30) Foreign Application Priority Data

Jan. 26, 2018   (JP) .............................. JP2018-011418

(51) Int. Cl.
| | |
|---|---|
| *H03L 1/02* | (2006.01) |
| *H03L 1/04* | (2006.01) |
| *G06N 3/08* | (2006.01) |
| *H03B 5/04* | (2006.01) |
| *H03B 5/32* | (2006.01) |
| *H03H 7/00* | (2006.01) |

(52) U.S. Cl.
CPC ............ *H03L 1/025* (2013.01); *G06N 3/084* (2013.01); *H03B 5/04* (2013.01); *H03B 5/32* (2013.01); *H03H 7/00* (2013.01); *H03L 1/04* (2013.01)

(58) Field of Classification Search
CPC ....................................................... H03L 1/025
USPC ......................................................... 331/176
See application file for complete search history.

(56) References Cited

U.S. PATENT DOCUMENTS

| | | |
|---|---|---|
| 9,092,726 B2 | 7/2015 | Esterline |
| 2008/0061899 A1 | 3/2008 | Stolpman |
| 2009/0108949 A1 | 4/2009 | Yan et al. |
| 2013/0041859 A1 | 2/2013 | Esterlilne |
| 2013/0328634 A1 | 12/2013 | Filipovic et al. |
| 2014/0337261 A1 | 11/2014 | Esterline |
| 2015/0142715 A1 | 5/2015 | Esterline et al. |

(Continued)

FOREIGN PATENT DOCUMENTS

JP    2017-085535 A    5/2017

OTHER PUBLICATIONS

Hivert, B and R. Brendel: "Neural Networks Trends For Frequency Control: A Review"; Proceedings of the 1995 IEEE International Frequency Control Symposium (49th Annual Symposium); IEEE; 1995; pp. 10-19.

(Continued)

*Primary Examiner* — Joseph Chang
(74) *Attorney, Agent, or Firm* — Harness, Dickey & Pierce, P.L.C.

(57) ABSTRACT

An integrated circuit device includes a digital signal processing circuit that generates frequency control data by performing a temperature compensation process by a neural network calculation process based on temperature detection data and an amount of change in time of the temperature detection data, and an oscillation signal generation circuit that generates an oscillation signal of a frequency set by the frequency control data using a resonator.

12 Claims, 25 Drawing Sheets

(56) References Cited

U.S. PATENT DOCUMENTS

2017/0117903 A1 4/2017 Fukuzawa et al.
2018/0342980 A1* 11/2018 Esterline .................. G06N 3/04

OTHER PUBLICATIONS

John C. Esterline, "Temperature Compensation of Crystal Oscillators Using an Artificial Neural Network", Greenray Industries, May 21-24, 2012, Frequency Control Symposium (FCS), 2012 IEEE International (7 Pages).

* cited by examiner

INTEGRATED CIRCUIT DEVICE, OSCILLATOR, ELECTRONIC DEVICE, AND VEHICLE

BACKGROUND

1. Technical Field

The present invention relates to an integrated circuit device, an oscillator, an electronic device, a vehicle, and the like.

2. Related Art

In the related art, oscillators such as a temperature compensated crystal oscillator (TCXO), an oven controlled crystal oscillator (OCXO), and a simple packaged crystal oscillator (SPXO) are known. For example, TCXO is an oscillator that is set to acquire a stable oscillation frequency with respect to a change in ambient temperature by compensating the temperature characteristics of the oscillation frequency of a quartz crystal resonator. TCXO is used as a reference signal source or the like in, for example, a portable communication terminal, a GPS-related device, a wearable device, or a vehicle-mounted device.

In the case of using the oscillator as a reference signal source, a high accuracy oscillation frequency needs to be implemented. Thus, a temperature compensation process has to be executed with high accuracy. For example, a method of using a neural network in the temperature compensation process for the quartz crystal resonator is disclosed in John C. Esterline, "Temperature Compensation of Crystal Oscillators Using an Artificial Neural Network", 21-24 May 2012, Frequency Control Symposium (FCS), 2012 IEEE International.

In the case of a resonator device (oscillator) that includes a resonator and an integrated circuit device, it is considered that the integrated circuit device acts as one heat source, and heat generated by the heat source propagates to the resonator. In this case, a delay in heat conduction may cause a difference between the temperature of the resonator and the temperature of the integrated circuit device. However, in the invention disclosed in John C. Esterline, "Temperature Compensation of Crystal Oscillators Using an Artificial Neural Network", 21-24 May 2012, Frequency Control Symposium (FCS), 2012 IEEE International, neural network calculation is performed using detected temperature detection data as needed. Thus, heat conduction between the integrated circuit device (temperature sensor) and the resonator cannot be considered, and a problem arises in that the accuracy of the temperature compensation process cannot be increased.

SUMMARY

An advantage of some aspects of the invention is to solve at least a part of the problems described above, and the invention can be implemented as the following forms or aspects.

An aspect of the invention relates to an integrated circuit device including a digital signal processing circuit that generates frequency control data by performing a temperature compensation process using a neural network calculation process based on temperature detection data and an amount of change in time of the temperature detection data, and an oscillation signal generation circuit that generates an oscillation signal of a frequency set by the frequency control data using a resonator.

In the aspect of the invention, the temperature compensation process is performed by neural network calculation using the amount of change in time of the temperature detection data from the temperature sensor. By doing so, the neural network calculation (temperature compensation process) in which heat conduction between the integrated circuit device and the resonator is considered can be performed. While a difference between a temperature detected by the temperature sensor and the temperature of the resonator is a cause of decrease in the accuracy of the temperature compensation process, using the amount of change in time enables a process in which the difference is considered, and the temperature compensation process can be performed with higher accuracy than that in a case where the temperature detection data is used as needed.

In the aspect of the invention, the integrated circuit device may further include a drive circuit that drives the resonator, a first oscillation terminal coupled to one of an input node or an output node of the drive circuit, a second oscillation terminal coupled to the other of the input node or the output node of the drive circuit, a power supply terminal where a power supply voltage is supplied, an output terminal from which the oscillation signal is output, and a first temperature sensor that generates the temperature detection data. A distance between the first temperature sensor and the first oscillation terminal may be smaller than at least one of a distance between the first temperature sensor and the power supply terminal or a distance between the first temperature sensor and the output terminal.

The drive circuit needs to be electrically coupled to the resonator, and the first oscillation terminal and the second oscillation terminal constitute a main heat conduction path between the integrated circuit device and the resonator. As described above, by disposing the temperature sensor at a position closer to the first oscillation terminal than the power supply terminal or the output terminal, a change in temperature based on heat conduction to the resonator is easily detected. Thus, the accuracy of the temperature compensation process in which heat conduction between the integrated circuit device and the resonator is considered can be improved.

In the aspect of the invention, the integrated circuit device may further include a second temperature sensor. A distance between the second temperature sensor and the second oscillation terminal may be smaller than at least one of a distance between the second temperature sensor and the power supply terminal or a distance between the second temperature sensor and the output terminal.

By disposing the temperature sensor at a position closer to the second oscillation terminal than the power supply terminal or the output terminal, a change in temperature based on heat conduction to the resonator is further easily detected. Thus, the accuracy of the temperature compensation process in which heat conduction between the integrated circuit device and the resonator is considered can be improved.

In the aspect of the invention, the integrated circuit device may further include a third temperature sensor and a support terminal in which an electrode for supporting the resonator is disposed. A distance between the third temperature sensor and the support terminal may be smaller than at least one of a distance between the third temperature sensor and the power supply terminal or a distance between the third temperature sensor and the output terminal.

The support terminal is a terminal that is used for connection between the integrated circuit device and the resonator. Thus, the support terminal constitutes a main heat conduction path between the integrated circuit device and the resonator. As described above, by disposing the temperature sensor at a position closer to the support terminal than the power supply terminal or the output terminal, a change in temperature based on heat conduction to the resonator is further easily detected. Thus, the accuracy of the temperature compensation process in which heat conduction between the integrated circuit device and the resonator is considered can be improved.

In the aspect of the invention, the integrated circuit device may further include a third temperature sensor and a support terminal in which an electrode for supporting a relay substrate on which the resonator is mounted is disposed. A distance between the third temperature sensor and the support terminal may be smaller than at least one of a distance between the third temperature sensor and the power supply terminal or a distance between the third temperature sensor and the output terminal.

Even with the relay substrate, the support terminal is a terminal that is used for connection between the integrated circuit device and the resonator. Thus, the support terminal constitutes a main heat conduction path between the integrated circuit device and the resonator. By disposing the temperature sensor at a position closer to the support terminal than the power supply terminal or the output terminal, a change in temperature based on heat conduction to the resonator is further easily detected. Thus, the accuracy of the temperature compensation process in which heat conduction between the integrated circuit device and the resonator is considered can be improved.

In the aspect of the invention, the digital signal processing circuit may perform the temperature compensation process based on a result of temperature compensation calculation using polynomial approximation and a result of the neural network calculation process.

By combining the polynomial approximation in the neural network calculation, the number of neurons in a neural network can be reduced. Thus, the load of the neural network calculation can be reduced, and the amount of data of a parameter stored in a storage unit can be reduced.

In the aspect of the invention, the digital signal processing circuit may obtain a temperature estimation value of the resonator by the neural network calculation process and perform the temperature compensation calculation based on the polynomial approximation using the obtained temperature estimation value.

By obtaining the temperature estimation value of the resonator, the temperature compensation process can be executed with high accuracy.

In the aspect of the invention, the digital signal processing circuit may obtain the temperature estimation value by a first neural network calculation process based on the temperature detection data and the amount of change in time, obtain first frequency control data by a second neural network calculation process based on the temperature estimation value, obtain second frequency control data by the temperature compensation calculation based on the polynomial approximation, and obtain the frequency control data based on the first frequency control data and the second frequency control data.

With this configuration, the frequency control data can be calculated by combining two stages of neural network calculation and the polynomial approximation using the temperature estimation value.

In the aspect of the invention, the digital signal processing circuit may obtain the temperature estimation value and first frequency control data by third neural network calculation based on the temperature detection data and the amount of change in time, obtain second frequency control data by the temperature compensation calculation based on the polynomial approximation, and obtain the frequency control data based on the first frequency control data and the second frequency control data.

With this configuration, the frequency control data can be obtained by combining one neural network calculation and the polynomial approximation using the temperature estimation value.

Another aspect of the invention relates to an integrated circuit device including first to N-th (N is an integer greater than or equal to two) temperature sensors, an A/D conversion circuit that performs A/D conversion on first to N-th temperature detection voltages from the first to N-th temperature sensors and outputs first to N-th temperature detection data, a digital signal processing circuit that generates frequency control data by performing a temperature compensation process by a neural network calculation process based on an amount of change in time of i-th (i is an integer satisfying $1 \leq i \leq N$) temperature detection data of the first to N-th temperature detection data, and an oscillation signal generation circuit that generates an oscillation signal of an oscillation frequency corresponding to the frequency control data using a resonator.

In the aspect of the invention, a plurality of temperature sensors are disposed in the integrated circuit device. A plurality of pieces of temperature detection data from the plurality of temperature sensors are acquired. The temperature compensation process is performed by the neural network calculation using the amount of change in time of at least one of the plurality of pieces of temperature detection data. By doing so, the neural network calculation (temperature compensation process) in which heat conduction between the integrated circuit device and the resonator is considered can be performed. While a difference between a temperature detected by the temperature sensor and the temperature of the resonator is a cause of decrease in the accuracy of the temperature compensation process, using the plurality of temperature sensor and using the amount of change in time enable a process in which the difference is considered, and the temperature compensation process can be performed with higher accuracy than that in a case where a single temperature sensor is used or a case where the temperature detection data is used as needed.

Still another aspect of the invention relates to an oscillator including a resonator and an integrated circuit device. The integrated circuit includes a digital signal processing circuit that generates frequency control data by performing a temperature compensation process using a neural network calculation process based on temperature detection data and an amount of change in time of the temperature detection data and an oscillation signal generation circuit that generates an oscillation signal of a frequency set by the frequency control data using the resonator.

Still another aspect of the invention relates to an electronic device including the integrated circuit device.

Still another aspect of the invention relates to a vehicle including the integrated circuit device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an exemplary embodiment of the invention will be described in detail. The embodiment described below does not unduly limit the content of the invention disclosed in the appended claims, and not all configurations described in the embodiment are necessarily a solution of the invention.

1. Method of Embodiment

First, a method of the embodiment will be described. An oscillator such as TCXO is used as a reference signal source or the like in various devices. For example, while frequency division duplex (FDD) is used thus far as a communication scheme between a base station and a communication terminal, time division duplex (TDD) is used in a next generation communication scheme such as 5G. In the TDD scheme, data is transmitted and received in a time division manner using the same frequency in an uplink and a downlink, and a guard time is set between time slots allocated to each device. Thus, in order to implement appropriate communication, each device needs to synchronize time, and accurate tracking of absolute time is required. In addition, in the case of using the oscillator as a reference signal source, a problem of so-called holdover arises. For example, frequency fluctuation can be reduced by synchronizing the oscillation signal (output signal) of the oscillator with a reference signal from GPS or a network using a PLL circuit. However, in a case where the holdover in which the reference signal from GPS or the network (Internet) is lost or affected occurs, the reference signal for synchronization cannot be acquired. Accordingly, in a case where such holdover occurs, the absolute time needs to be tracked on the oscillator side in the absence of the reference signal, and communication fails in a case where the tracked time deviates. Thus, the oscillator requires very high frequency stability even in the holdover period.

Figure 1:
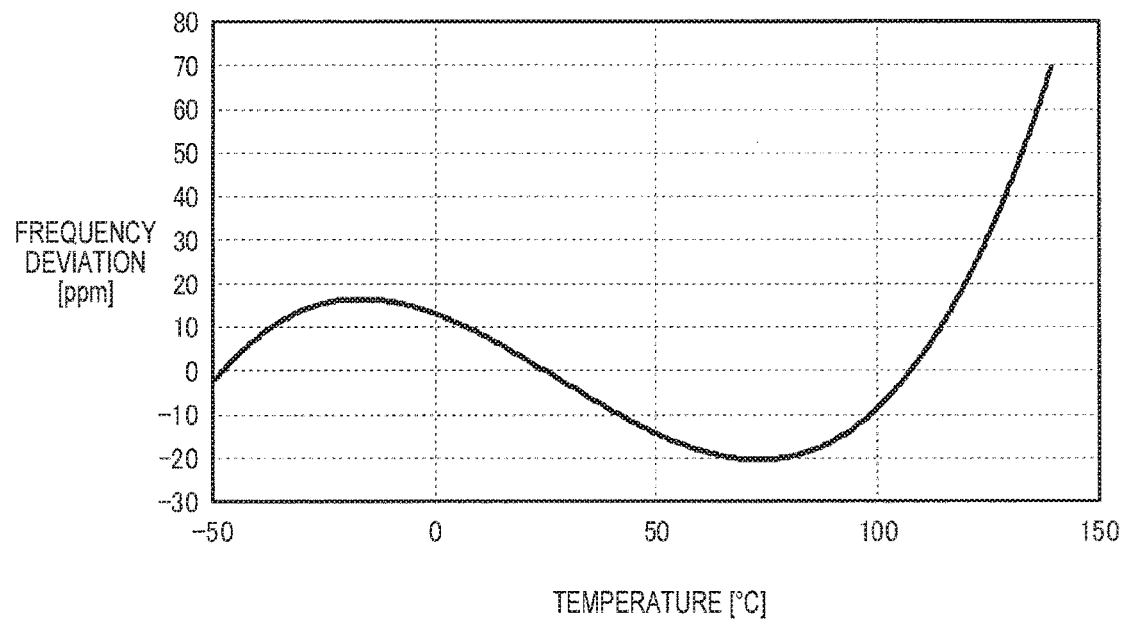
FIG. 1 is an example of the temperature characteristics of a resonator.

The temperature characteristics of a resonator are considered to be a cause of decrease in the accuracy of the oscillation frequency. FIG. 1 is an example of the temperature characteristics of a quartz crystal resonator. A horizontal axis denotes a temperature, and a vertical axis denotes a frequency deviation (an error with respect to a set frequency). As illustrated in FIG. 1, the quartz crystal resonator has temperature characteristics similar to a cubic function. Thus, an integrated circuit device (in a narrow sense, DPS) of the oscillator executes a temperature compensation process that reduces fluctuation of the oscillation frequency accompanied by temperature fluctuation. For example, as will be described using FIG. 11, a digital signal processing circuit 23 (DSP) outputs frequency control data DDS based on temperature detection data TD, and an oscillation signal generation circuit 40 controls the oscillation frequency of a resonator 10 based on the frequency control data DDS.

For example, it is considered that the oscillation frequency of the resonator 10 is controlled by including a varactor as a variable capacitance circuit in the oscillation signal generation circuit 40 and changing a capacitance value by controlling a voltage applied to the varactor.

Figure 2:
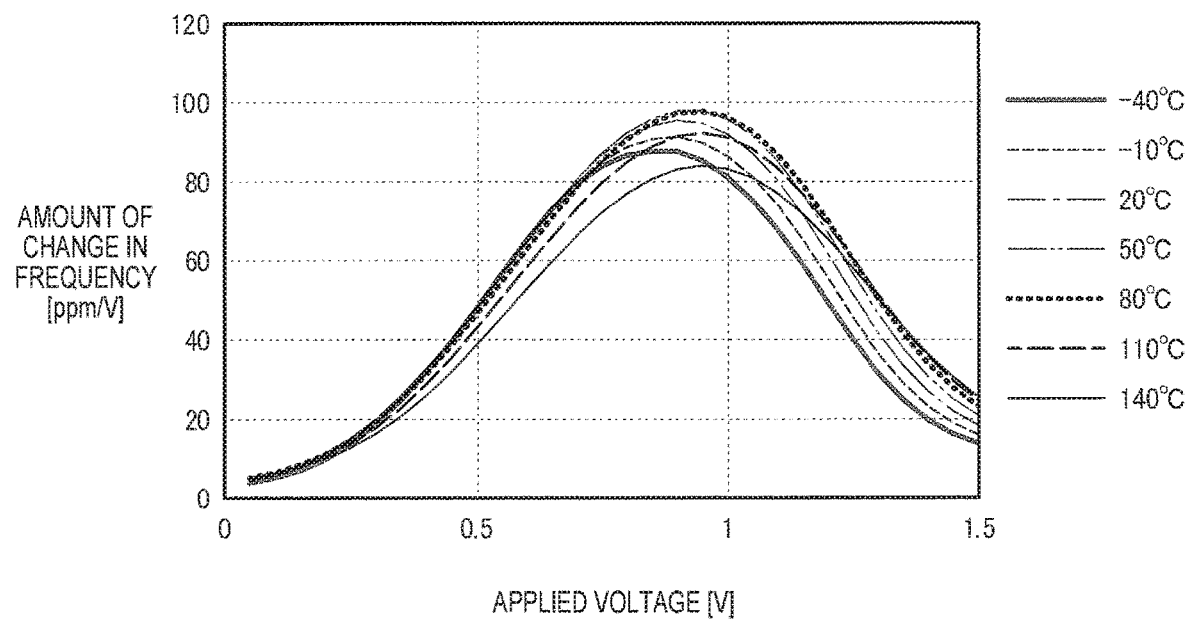
FIG. 2 is an example of the temperature characteristics of a variable capacitance circuit (varactor).

FIG. 2 is an example of the temperature characteristics of the varactor. A horizontal axis denotes the applied voltage, and a vertical axis denotes the amount of change in frequency (unit: ppm/V). In FIG. 2, seven temperatures between −40° C. and 140° C. are illustrated. As is understood from FIG. 2, the amount of change in frequency caused by the varactor changes depending on the temperature.

In such a case, the temperature characteristics of the oscillation frequency are determined by superposition of the temperature characteristics of the resonator 10 illustrated in FIG. 1 and the temperature characteristics of the varactor illustrated in FIG. 2. Thus, the relationship between the temperature and the frequency or the frequency deviation is not represented by a smooth polynomial, and a local change in value such as a dip occurs.

Figure 3:
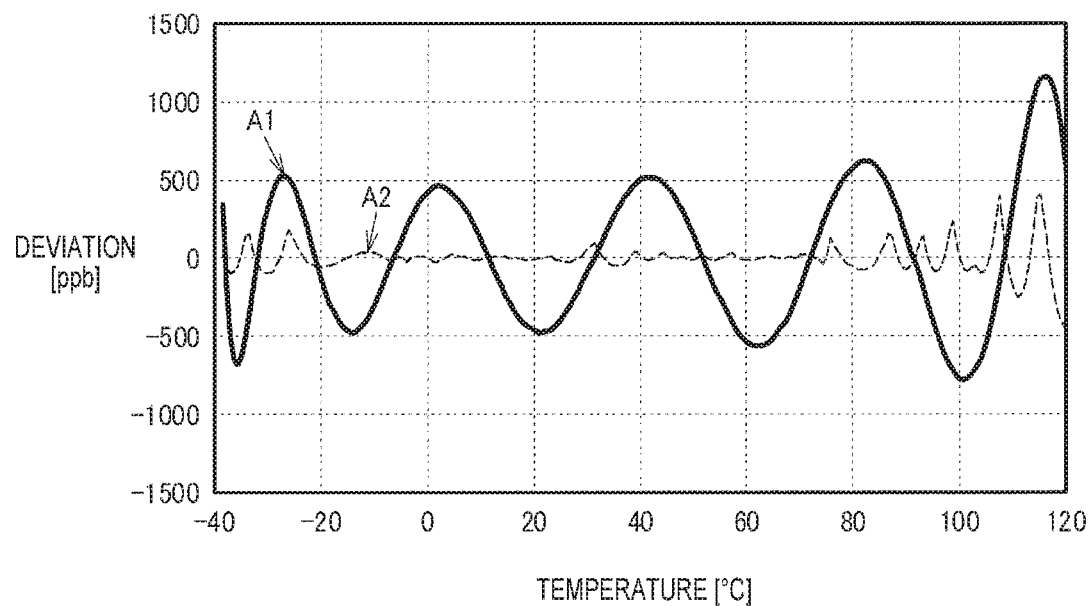
FIG. 3 is an example of the result of a temperature compensation process based on polynomial approximation and the result of the temperature compensation process in combination with a neural network calculation.

FIG. 3 is a diagram representing the result of the temperature compensation process, and A1 in FIG. 3 represents the result of the temperature compensation process based on 12-degree polynomial approximation. In FIG. 3, a horizontal axis denotes the temperature, and a vertical axis denotes the frequency deviation. As is understood from A1 in FIG. 3, a certain degree of error is left in the temperature compensation process based on polynomial approximation. It is considered that problems do not arise with the accuracy illustrated by A1 depending on the application of the oscillator. However, in a case where a very high accuracy oscillation frequency needs to be implemented as in the above example of TDD, sufficient accuracy is not acquired with polynomial approximation.

Meanwhile, a method of using a neural network in the temperature compensation process as in John C. Esterline, "Temperature Compensation of Crystal Oscillators Using an Artificial Neural Network", 21-24 May 2012, Frequency Control Symposium (FCS), 2012 IEEE International is considered. The neural network is known to enable approximation of a function of any shape with high accuracy. Thus, even in a case where characteristics are complicated by superposition of the temperature characteristics of the resonator 10 and the varactor, it is considered that a high accuracy temperature compensation process is enabled.

However, a single temperature sensor is used in John C. Esterline, "Temperature Compensation of Crystal Oscillators Using an Artificial Neural Network", 21-24 May 2012, Frequency Control Symposium (FCS), 2012 IEEE International. While accuracy can be improved by increasing the number of inputs in the neural network, the number of inputs is small in John C. Esterline, "Temperature Compensation of Crystal Oscillators Using an Artificial Neural Network", 21-24 May 2012, Frequency Control Symposium (FCS), 2012 IEEE International, thereby posing a problem in that it is difficult to perform the temperature compensation process with high accuracy.

In addition, as illustrated in FIG. 1, the temperature of the resonator 10 is important in the temperature compensation process. However, it is not easy to dispose a temperature sensor in the resonator 10. A temperature sensor 26 is disposed in a location, particularly, an integrated circuit device 20, other than the resonator 10.

Figure 4:
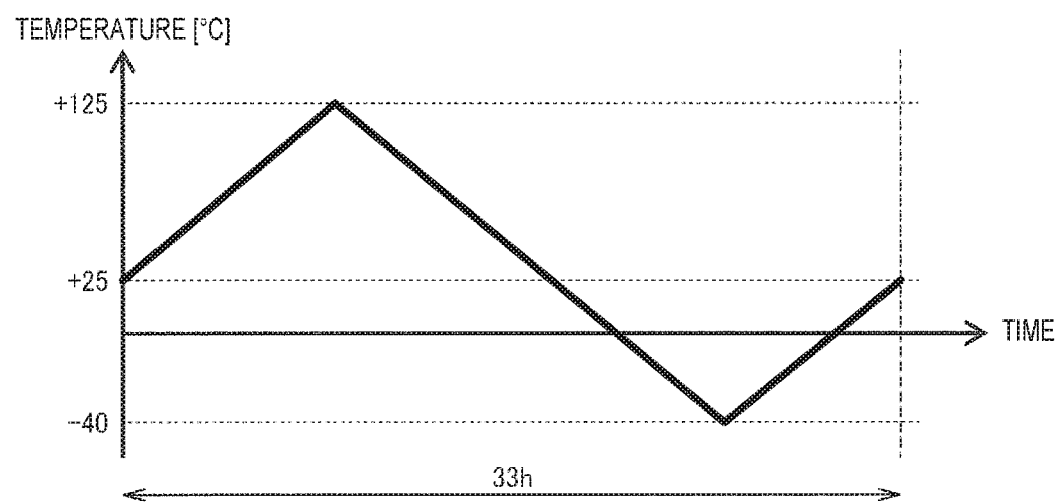
FIG. 4 is an example of a temperature sweep in an inspection step.

FIG. 4 is an example of a temperature sweep in an inspection step. In FIG. 4, a horizontal axis denotes time, and a vertical axis denotes the temperature of a constant temperature chamber used in the inspection step. In the example in FIG. 4, a control that increases the temperature to +125° C. from +25° C. as a starting point, then performs cooling to −40° C., and then, returns the temperature to +25° C. is performed for 33 hours. Usually, in the inspection step, the temperature sweep is performed as in FIG. 4, and the temperature detection data TD and the frequency control data DDS at that point are obtained. A learning process of the neural network and a process of determining the coefficient of a polynomial approximation function are executed using the obtained values as learning data (training data).

Figure 5:
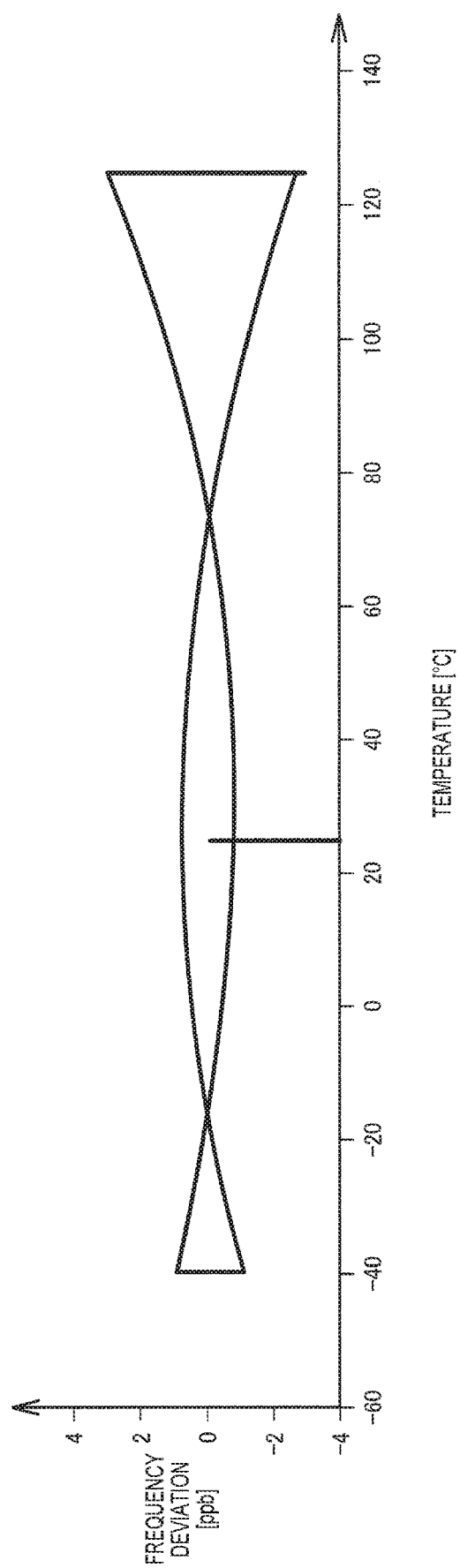
FIG. 5 is an example of a relationship between a temperature and a frequency deviation during the temperature sweep.

FIG. 5 is a diagram representing a simulation result of the temperature compensation process in a case where the temperature sweep illustrated in FIG. 4 is performed. In FIG. 5, a horizontal axis denotes time, and a vertical axis denotes the frequency deviation (unit: ppb). In FIG. 5, heat conduction between the integrated circuit device and the resonator is regarded as a low pass filter (hereinafter, referred to as LPF), and a simple correction system that performs the temperature compensation process based on polynomial approximation using a signal acquired after a low pass filter process on a temperature signal is assumed. As the cutoff frequency of LPF is decreased, a delay in heat conduction between the temperature sensor and the resonator is extended. As the cutoff frequency of LPF is increased, a delay in heat conduction between the temperature sensor and the resonator is shortened. FIG. 5 illustrates a simulation result in a case where the cutoff frequency is set to 1 Hz (the heat conduction delay is one second).

As is understood from FIG. 5, in a case where the cutoff frequency is 1 Hz, the width of the frequency deviation is increased to a certain degree. Specifically, even at the same temperature, the frequency deviation after the temperature compensation process varies at an increase in temperature and at a decrease in temperature (hysteresis occurs). This simulation result indicates that even in a case where the heat conduction delay between the temperature sensor 26 and the resonator 10 is approximately one second, the delay causes the temperature compensation process not to be executed with sufficient accuracy. In a case where the cutoff frequency is high (that is, in a case where the heat conduction delay is short), the frequency deviation can be restricted to fall within a narrow range. However, as is understood from FIG. 5, the allowed heat conduction delay for acquiring sufficient accuracy is shorter than one second.

Figure 6:
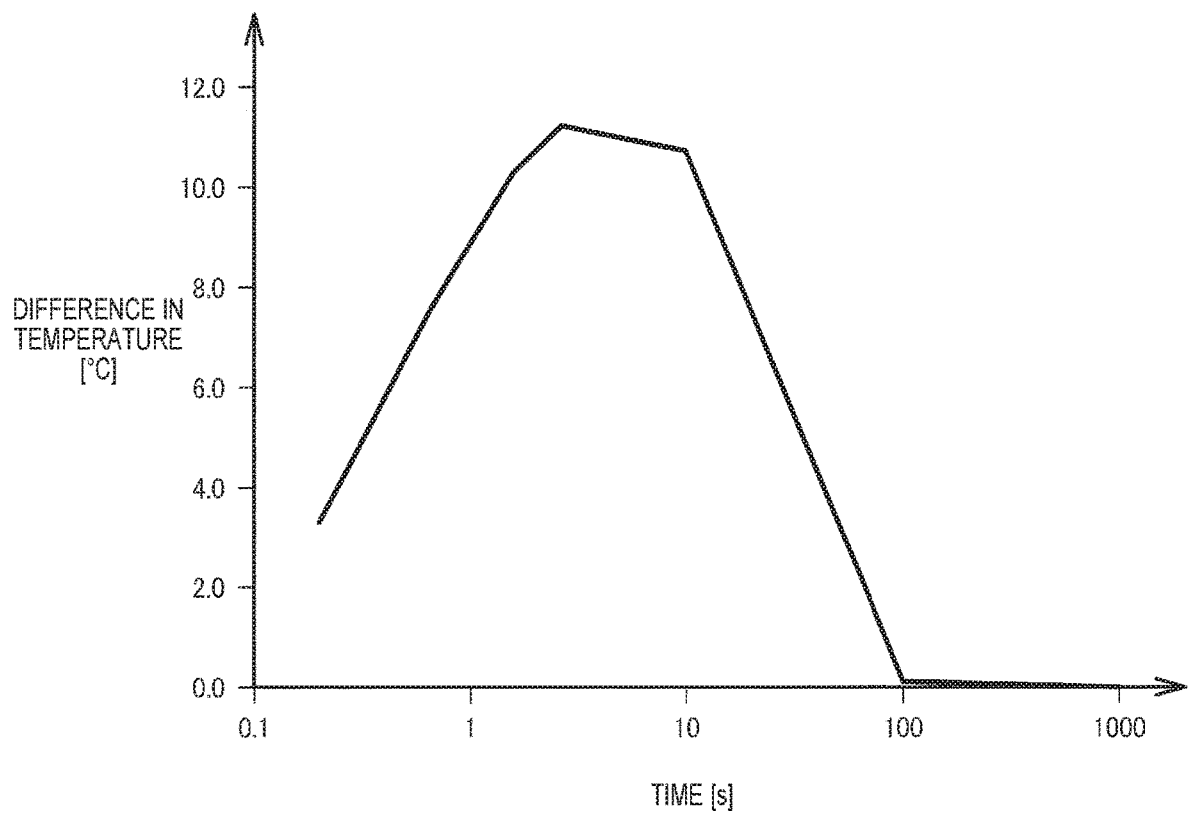
FIG. 6 is an example of a difference in temperature between a detection temperature of a temperature sensor and the temperature of the resonator.

FIG. 6 is a diagram for describing heat conduction between the temperature sensor 26 and the resonator 10. In FIG. 6, a horizontal axis denotes the logarithm of elapsed time, and a vertical axis denotes a difference in temperature between the temperature sensor 26 and the resonator 10. FIG. 6 is the result of simulation of a state where heat is generated from a given circuit of the integrated circuit device 20 as a heat source, and the heat propagates. As illustrated in FIG. 6, first, the temperature of the temperature sensor 26 that is relatively close to the heat source is increased, and the difference in temperature with the resonator 10 is increased. Since heat is also transmitted to the resonator 10 along with an elapse of time, the temperature of the resonator 10 is also increased, and the difference in temperature between the temperature sensor 26 and the resonator 10 is soon decreased to zero.

As is understood from FIG. 6, a delay of approximately 100 seconds is present in heat conduction between the temperature sensor 26 and the resonator 10. That is, setting the heat conduction delay to be shorter than one second is not realistic. From FIG. 5 and FIG. 6, it is understood that the heat conduction delay between the temperature sensor 26 and the resonator 10 cannot be ignored as a cause of decreasing the accuracy of the temperature compensation process. That is, in order to perform the temperature compensation process with high accuracy, a process that considers heat conduction between the integrated circuit device 20 and the resonator 10 needs to be performed.

From such a point, in the case of using a single temperature sensor as in John C. Esterline, "Temperature Compensation of Crystal Oscillators Using an Artificial Neural Network", 21-24 May 2012, Frequency Control Symposium (FCS), 2012 IEEE International, heat conduction cannot be reflected on the process. As described above, in the case of focusing on a given temperature, the oscillation frequency changes depending on whether the given temperature is a temperature at the time of increase or a temperature at the time of decrease, or depending on the degree of a temperature gradient. Thus, using a single temperature sensor cannot distinguish between those situations.

In addition, many circuits are disposed in the integrated circuit device 20. Thus, the circuit as a heat source may be changed. In that case, heat conduction from the heat source to the temperature sensor 26 and heat conduction from the heat source to the resonator 10 are changed. For example, as will be described using FIG. 19 and the like, the temperature sensor 26 is disposed in the vicinity of one heat transmission path in a case where a plurality of heat transmission paths are present between the integrated circuit device 20 and the resonator 10. In this case, in a case where the heat source is close to the heat transmission path, the detection temperature of the temperature sensor 26 is instantly increased. Thus, the difference in temperature between the temperature sensor 26 and the resonator 10 is likely to be increased. Meanwhile, in a case where the heat source is close to a heat transmission path on another side, transfer of a certain amount of heat to the resonator 10 is started through the heat transmission path on the other side when the detection temperature of the temperature sensor 26 is increased. Thus, the difference in temperature between the temperature sensor 26 and the resonator 10 is considered to be decreased. That is, the temperature of the resonator 10 may vary even in a case where the detection temperature of the temperature sensor 26 is the same.

As described above, the neural network is considered to be useful for the temperature compensation process. However, in a case where the input is not appropriately set, sufficient accuracy is not acquired. Meanwhile, broadly two measures are considered in the embodiment.

A first measure is such that a plurality of temperature sensors 26 are disposed in the integrated circuit device 20 in the embodiment. The integrated circuit device 20 of the embodiment includes the first to N-th (N is an integer greater than or equal to two) temperature sensors 26, an A/D conversion circuit 27, the digital signal processing circuit 23 (a processor or DSP), and the oscillation signal generation circuit 40. The A/D conversion circuit 27 performs A/D conversion on first to N-th temperature detection voltages from the first to N-th temperature sensors 26 and outputs first to N-th temperature detection data TD1 to TDN. The digital signal processing circuit 23 generates the frequency control data DDS by performing the temperature compensation process using a neural network calculation process based on the first to N-th temperature detection data TD1 to TDN. The oscillation signal generation circuit 40 generates an oscillation signal of a frequency set by the frequency control data DDS using the resonator 10.

The integrated circuit device 20 represents a device in which the circuits such as the A/D conversion circuit 27, the digital signal processing circuit 23, and the oscillation signal generation circuit 40 and the temperature sensors 26 are integrated in one chip.

By disposing the plurality of temperature sensors in the integrated circuit device 20, the temperature compensation process in which heat conduction is considered can be performed, and a high accuracy oscillation frequency can be implemented. Specifically, a combination of N pieces of temperature detection data TD1 to TDN changes depending on the position of the heat source, the amount of generated heat, or a change in temperature. Thus, heat conduction is considered in the neural network calculation process that takes data based on the first to N-th temperature detection data TD1 to TDN as input. In a case where it is considered that heat conduction is reflected on the first to N-th temperature detection data TD1 to TDN, the temperature sensors 26 are desirably arranged at positions away from each other to a certain degree. In addition, in a case where it is considered that the temperature of the resonator 10 is important, each temperature sensor 26 is desirably arranged in the vicinity of the heat transmission path between the integrated circuit device 20 and the resonator 10. An example of arrangement of the temperature sensors 26 will be described below.

In addition, a second measure is such that the amount of change in time of the temperature detection data TD is used in addition to the temperature detection data TD of the temperature sensor 26 in the embodiment. The integrated circuit device 20 of the embodiment includes the digital signal processing circuit 23 that generates the frequency control data DDS by performing the temperature compensation process using the neural network calculation process based on the temperature detection data TD and the amount of change in time of the temperature detection data TD, and the oscillation signal generation circuit 40. The oscillation signal generation circuit 40 generates an oscillation signal of a frequency set by the frequency control data DDS using the resonator 10 in the same manner as the above example.

The amount of change in time of the temperature detection data TD represents the amount of change of the temperature detection data TD per predetermined time. For example, the amount of change in time of the temperature detection data TD is information related to the difference between the temperature detection data corresponding to a process target timing and the temperature detection data acquired at a timing earlier than the process target timing (in a narrow sense, the immediately previous timing).

By using the amount of change in time of the temperature detection data TD as an input of the neural network calculation, whether the temperature detection data TD is a temperature at the time of increase or at the time of decrease can be distinguished even in a case where the value of the temperature detection data TD is the same. In addition, the magnitude of the amount of change in time represents the rapidness of a change in temperature. Thus, a rapid change in temperature and a gradual change in temperature can be distinguished. That is, since the neural network calculation in which heat conduction is considered can be performed using the amount of change in time, the temperature compensation process can be performed with high accuracy.

Hereinafter, the above two combinations will be described. That is, the integrated circuit device 20 includes the first to N-th (N is an integer greater than or equal to two) temperature sensors 26, the A/D conversion circuit 27 that performs A/D conversion on the first to N-th temperature detection voltages from the first to N-th temperature sensors 26 and outputs the first to N-th temperature detection data TD1 to TDN, the digital signal processing circuit 23 that generates the frequency control data by performing the temperature compensation process using the neural network calculation process based on the amount of change in time of the i-th temperature detection data TDi among the first to N-th temperature detection data TD1 to TDN, and the oscillation signal generation circuit 40 that generates an oscillation signal of an oscillation frequency corresponding to the frequency control data using the resonator 10. Either a configuration that uses the plurality of temperature sensors 26, or a configuration that uses the amount of change in time may not be included.

In addition, the temperature compensation process may be implemented using only the neural network calculation. However, the number of neurons needs to be increased in order to increase accuracy, and the amount of information stored in a storage unit 24 (non-volatile memory) is increased.

Thus, in the embodiment, the digital signal processing circuit 23 performs the temperature compensation process based on the result of the temperature compensation calculation based on polynomial approximation and the result of the neural network calculation process. By doing so, a high accuracy temperature compensation process can be implemented with a reduced memory capacity. Specifically, A2 in FIG. 3 corresponds to the result of the temperature compensation process in a case where polynomial approximation (least squares method) and the neural network calculation process are combined. As is understood from A2 in FIG. 3, a very high accuracy temperature compensation process can be implemented in the embodiment.

While the embodiment in which polynomial approximation and the neural network are combined will be described below, polynomial approximation may not be performed.

2. Configuration Example

Figure 7:
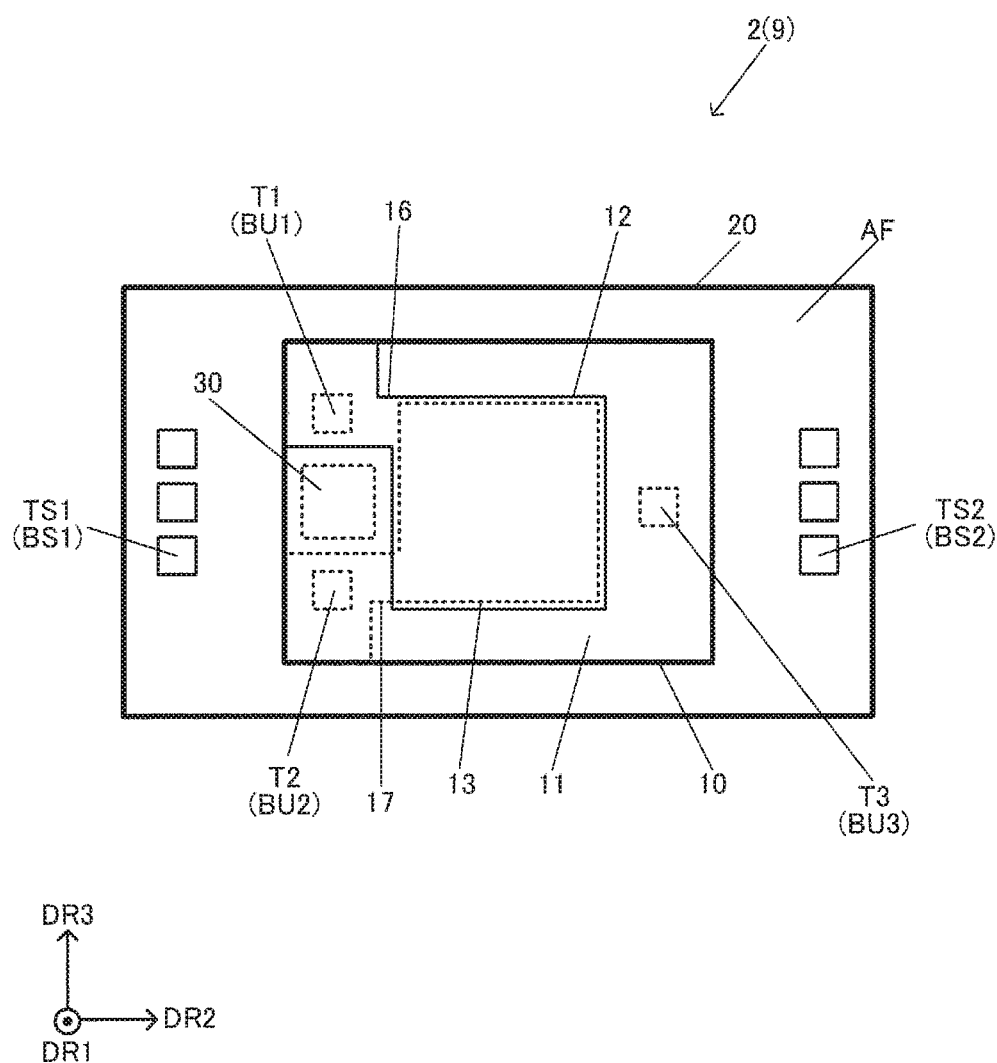
FIG. 7 is a plan view illustrating a configuration of a resonator device including an integrated circuit device and the resonator.
Figure 8:
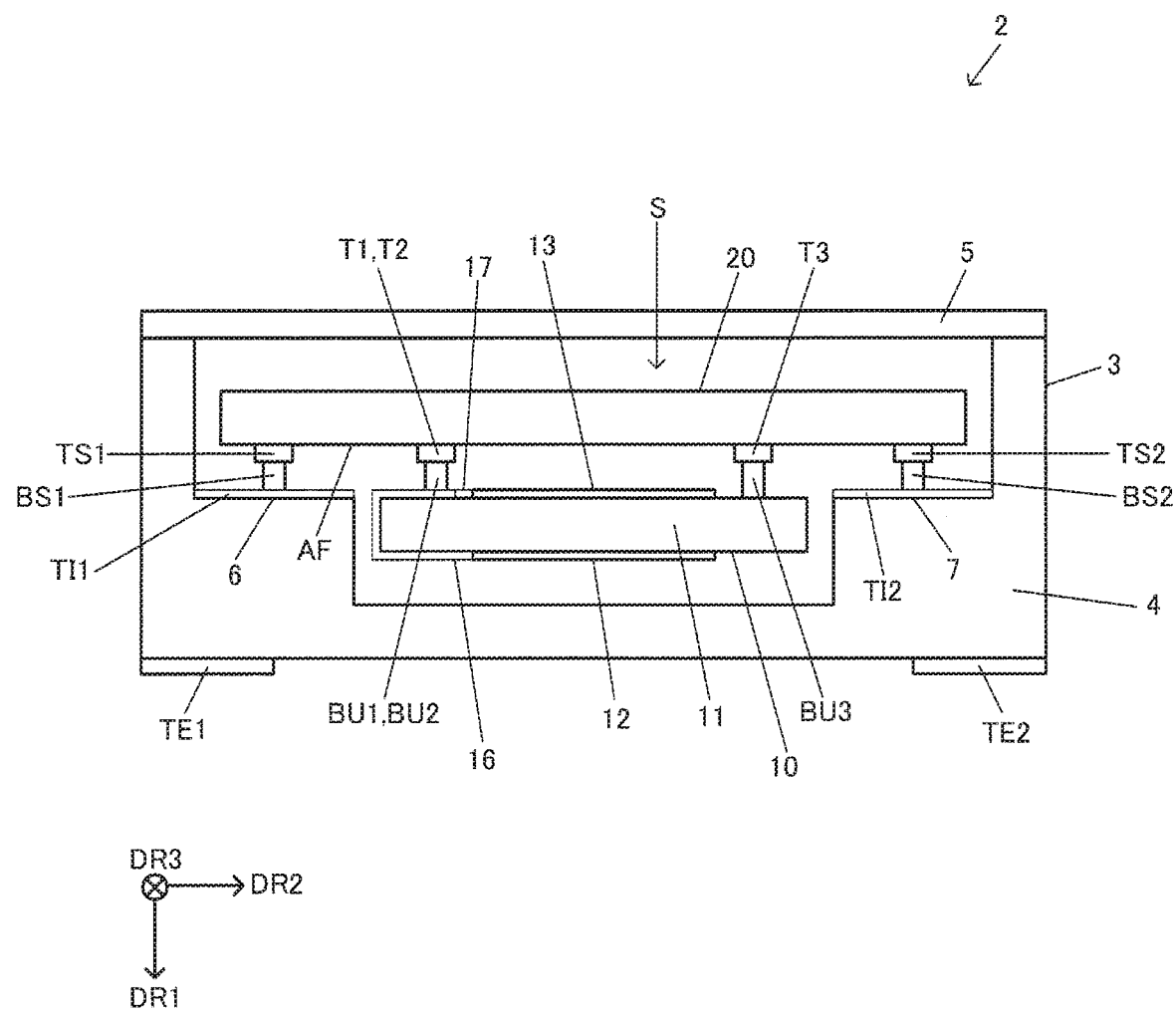
FIG. 8 is a sectional view illustrating a configuration of the resonator device including the integrated circuit device and the resonator.

FIG. 7 and FIG. 8 illustrate a configuration example of a resonator device 2 (oscillator) that includes the integrated circuit device 20 of the embodiment. FIG. 7 is a plan view illustrating the resonator device 2 of the embodiment, and FIG. 8 is a sectional view (side view) of the resonator device 2. The resonator device 2 includes the integrated circuit device 20 (IC) that includes the resonator 10 and a drive circuit 30 which drives the resonator 10. In addition, the resonator device 2 can further include a package 3 on which the resonator 10 and the integrated circuit device 20 are mounted. The resonator 10 is disposed on an active surface AF side (circuit element surface side) of the integrated circuit device 20. The active surface AF is a surface on which an active element (circuit element) such as a transistor of the integrated circuit device 20 is formed. In FIG. 7 and FIG. 8, a direction from the integrated circuit device 20 toward the resonator 10 is denoted by DR1 (first direction). The direction DR1 is a direction that is orthogonal to a semiconductor substrate of the integrated circuit device 20. In addition, directions that are orthogonal to the direction DR1 are denoted by directions DR2 and DR3 (second and third directions). For example, the direction DR2 is a direction in the long edge direction of the integrated circuit device 20, and the direction DR3 is a direction in the short edge direction of the integrated circuit device 20. The resonator device 2 is not limited to the configurations in FIG. 7 and FIG. 8. Various modifications can be made such that a part of the constituents is not included, or another constituent is added.

The resonator 10 is an element (resonating element) that generates mechanical resonance by an electric signal. The resonator 10 can be implemented by a resonator element (piezoelectric resonator element) such as a quartz crystal resonator element. For example, the resonator 10 can be implemented by a quartz crystal resonator element that has a cut angle of AT cut or SC cut and generates thickness-shear resonance. For example, the resonator 10 is a resonator incorporated in a temperature compensated oscillator (TCXO) that does not include a constant temperature chamber. Alternatively, the resonator 10 may be a resonator or the like incorporated in a constant temperature chamber type oscillator (OCXO) that includes a constant temperature chamber. The resonator 10 of the embodiment can be implemented by various resonator elements such as a resonator element of a type other than a thickness-shear resonance type and a piezoelectric resonator element formed of a material other than quartz crystal. For example, a surface acoustic wave (SAW) resonator or a micro electro mechanical systems (MEMS) resonator as a silicon resonator that is formed using a silicon substrate can be employed as the resonator 10.

The resonator 10 includes a resonator element 11 (resonating substrate) and electrodes 12 and 13. The resonator element 11 is formed of a piezoelectric material. For example, the resonator element 11 is formed of quartz crystal. In a case where the surface of the resonator element 11 on the opposite side from the integrated circuit device 20 is referred to as a first surface, and the surface of the resonator element 11 on the integrated circuit device 20 side is referred to as a second surface, the electrode 12 is formed on the first surface of the resonator element 11, and the electrode 13 is formed on the second surface of the resonator element 11. In addition, the resonator 10 includes a terminal, not illustrated, and is electrically connected to a terminal of the integrated circuit device 20 through the terminal.

The integrated circuit device 20 has a rectangular shape in a plan view of the active surface AF and includes a semiconductor substrate. An active element such as a transistor is formed on the active surface AF of the semiconductor substrate. In addition, a passive element such as a resistor or a capacitor may be formed on the active surface AF. The rectangular shape referred hereto may not necessarily be a complete rectangular shape. The rectangular shape that partially has a projected shape or a recessed shape or has a curved edge is allowed.

The integrated circuit device 20 includes the drive circuit 30 that drives the resonator 10. In addition, the integrated circuit device 20 includes a terminal T1 (first terminal) that is electrically connected to the electrode 12 (first electrode) of the resonator 10 and is where an output signal is output to the resonator 10 from the drive circuit 30, and a terminal T2 (second terminal) that is electrically connected to the electrode 13 (second electrode) of the resonator 10 and is where an input signal is input into the drive circuit 30 from the resonator 10. In addition, the integrated circuit device 20 further includes a terminal T3 (third terminal) that is not electrically connected to the electrodes 12 and 13 (first and second electrodes) of the resonator 10. In addition, the integrated circuit device 20 may include terminals TS1 and TS2. While an example in which each of TS1 and TS2 includes three terminals is illustrated in FIG. 7, various modifications can be made for the specific number of terminals. TS1 or TS2 includes a terminal that is supplied with a high electric potential side power supply voltage VDD. In addition, TS1 or TS2 includes a terminal that is supplied with a low electric potential side power supply voltage VSS (for example, GND). That is, the terminals TS1 and TS2 include a power supply terminal for power supply, and the integrated circuit device 20 operates by the supply of the power supply voltages VDD and VSS. In addition, the terminals TS1 and TS2 include a signal terminal where various signals are output or input. For example, the terminals T1 to T3, TS1, and TS2 are called pads of the integrated circuit device 20. Being electrically connected means connection such that an electric signal is transmitted and delivered through wiring or the like. Being not electrically connected means that transmission of an electric signal is blocked, and the electric signal is not delivered.

For example, the integrated circuit device 20 drives the resonator 10 by the output signal (drive signal) of the drive circuit 30. The drive circuit 30 is implemented by, for example, an inverting amplification circuit (inverter circuit). An output signal OUT of the drive circuit 30 is output to the resonator 10 (electrode 12) through the terminal T1. In addition, an input signal IN (feedback signal) from the resonator 10 (electrode 13) is input into the drive circuit 30 through the terminal T2. Accordingly, an oscillation signal (clock signal) of a predetermined oscillation frequency can be generated by oscillating the resonator 10.

As illustrated in FIG. 8, the resonator device 2 includes the package 3 that is formed of ceramic or the like. The package 3 has an accommodation space S inside, and the resonator 10 and the integrated circuit device 20 are accommodated in the accommodation space S. The accommodation space S is airtightly sealed and is in a depressurized state (desirably, a state similar to a vacuum). The package 3 enables the resonator 10 and the integrated circuit device 20 to be properly protected from impact, dust, heat, moisture, and the like. The package 3 includes a base 4 and a lid 5. Specifically, the package 3 is configured with the base 4 that supports the resonator 10 and the integrated circuit device 20, and the lid 5 that is joined to the upper surface of the base 4 such that the accommodation space S is formed between the base 4 and the lid 5.

As illustrated in the sectional view of FIG. 8, the base 4 includes a first recess portion and a second recess portion inside. The first recess portion is open on the upper surface of the base 4. The second recess portion is open on the bottom surface of the first recess portion. Step portions 6 and 7 are disposed on the bottom surface of the first recess portion. Internal terminals TI1 and TI2 of the resonator device 2 are formed in the step portions 6 and 7. The internal terminals TI1 and TI2 are electrically connected to external terminals TE1 and TE2 of the resonator device 2 through internal wiring (not illustrated) of the package 3. The external terminals TE1 and TE2 are formed on the outer bottom surface of the package 3. The external terminals TE1 and TE2 are connected to external devices through external wiring (wiring and the like of a circuit substrate). For example, the terminals TS1 and TS2 are disposed in the integrated circuit device 20, and conductive bumps BS1 and BS2 are disposed in the signal terminals TS1 and TS2. As illustrated in FIG. 8, the conductive bumps BS1 and BS2 of the signal terminals TS1 and TS2 are connected in contact to the internal terminals TI1 and TI2 of the resonator device 2. Accordingly, the signal terminals TS1 and TS2 of the integrated circuit device 20 are electrically connected to the external terminals TE1 and TE2 of the resonator device 2.

FIG. 7 is a plan view of the active surface AF of the integrated circuit device 20 and, for example, is a view seen from a direction opposite to the direction DR1. In the plan view of the active surface AF, the terminals T1, T2, and T3 of the integrated circuit device 20 are arranged to overlap with the resonator 10. As illustrated in the sectional view (a view seen from the direction DR3) of FIG. 8, the resonator 10 and the integrated circuit device 20 are attached to each other as a stack in their thickness direction. A unit in which the resonator 10 and the integrated circuit device 20 are attached to each other as a stack is called a resonator unit 9 (stack body).

As illustrated in FIG. 8, conductive bumps BU1, BU2, and BU3 (connection bumps) are disposed in the terminals T1, T2, and T3 of the integrated circuit device 20. The conductive bumps BU1, BU2, and BU3 are connection electrodes of a protrusion shape that are formed on the terminals T1, T2, and T3. For example, the conductive bumps BU1, BU2, and BU3 are metal bumps (gold bumps, silver bumps, copper bumps, or the like) formed of metal. A modification can be made such that a resin core bump that is configured by plating the core of a bump formed of resin with metal is used as the conductive bump.

The terminal T1 is electrically connected to the electrode 12 of the resonator 10 through a conductive bump B1. Specifically, as illustrated in FIG. 7 and FIG. 8, wiring 16 that is connected to the electrode 12, and a first connection terminal, not illustrated, that is connected to the wiring 16 are disposed in the resonator 10. The terminal T1 and the electrode 12 are electrically connected to each other through the conductive bump B1, the first connection terminal, and the wiring 16 by connecting the conductive bump B1 of the terminal T1 to the first connection terminal. In addition, the terminal T2 is electrically connected to the electrode 13 of the resonator 10 through a conductive bump B2. Specifically, wiring 17 that is connected to the electrode 13, and a second connection terminal, not illustrated, that is connected to the wiring 17 are disposed in the resonator 10. In FIG. 7, the electrode 13 and the wiring 17 are illustrated by dotted lines. The terminal T2 and the electrode 13 are electrically connected to each other through the conductive bump B2, the second connection terminal, and the wiring 17 by connecting the conductive bump B2 of the terminal T2 to the second connection terminal. While a case where the terminal T1 and the electrode 12 are electrically connected to each other, and the terminal T2 and the electrode 13 are electrically connected to each other is described above, the embodiment is not limited thereto. The terminal T1 and the electrode 13 may be electrically connected to each other, and the terminal T2 and the electrode 12 may be electrically connected to each other. For example, the electrode 13 may be the first electrode, and the electrode 12 may be the second electrode.

Meanwhile, the terminal T3 of the integrated circuit device 20 is a dummy terminal that is not electrically connected to the electrodes 12 and 13 of the resonator 10. For example, the conductive bump BU3 is formed in the terminal T3. The conductive bump BU3 is in contact with the resonator 10 but is not electrically connected to the electrodes 12 and 13 of the resonator 10. For example, the terminals T1 and T2 of the integrated circuit device 20 are connected to the first and second connection terminals of the resonator 10, but the terminal T3 is not connected to the first and second connection terminals.

The resonator 10 is supported on the active surface AF side of the integrated circuit device 20 using the conductive bumps BU1, BU2, and BU3 disposed in the terminals T1, T2, and T3. For example, the conductive bumps BU1, BU2, and BU3 (and the terminals T1, T2, and T3) are support members, and the resonator 10 is supported (supported at three points) by the integrated circuit device 20.

Figure 9:
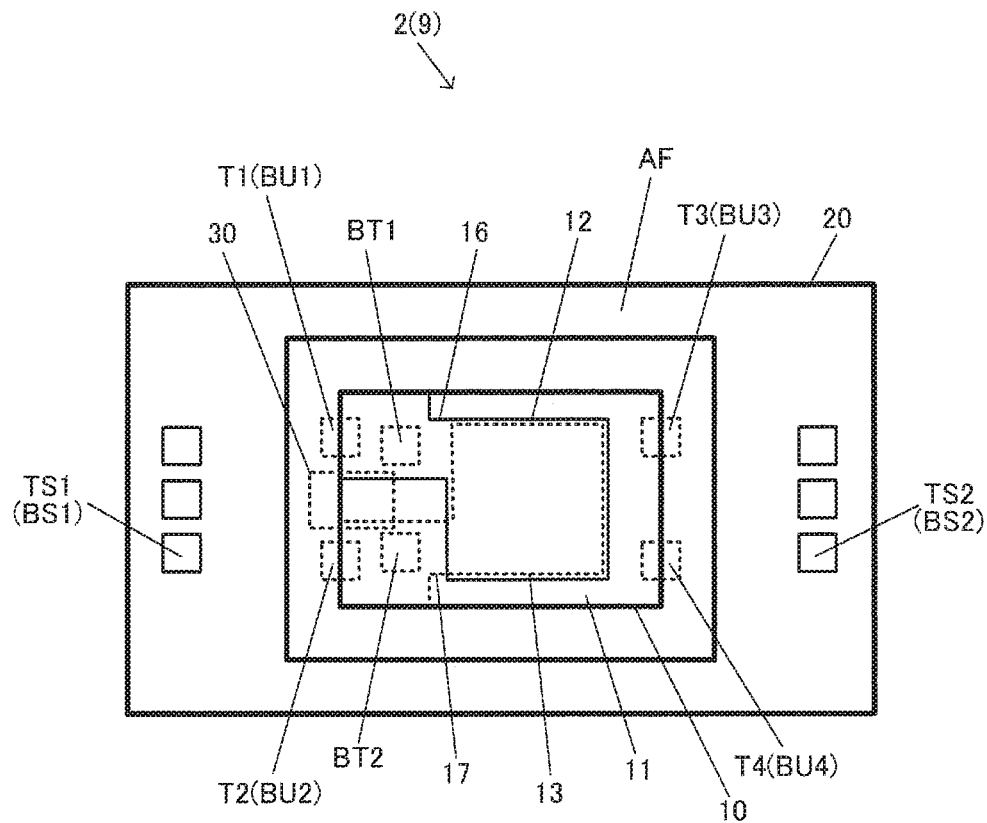
FIG. 9 is another plan view illustrating a configuration of the resonator device including the integrated circuit device and the resonator.
Figure 10:
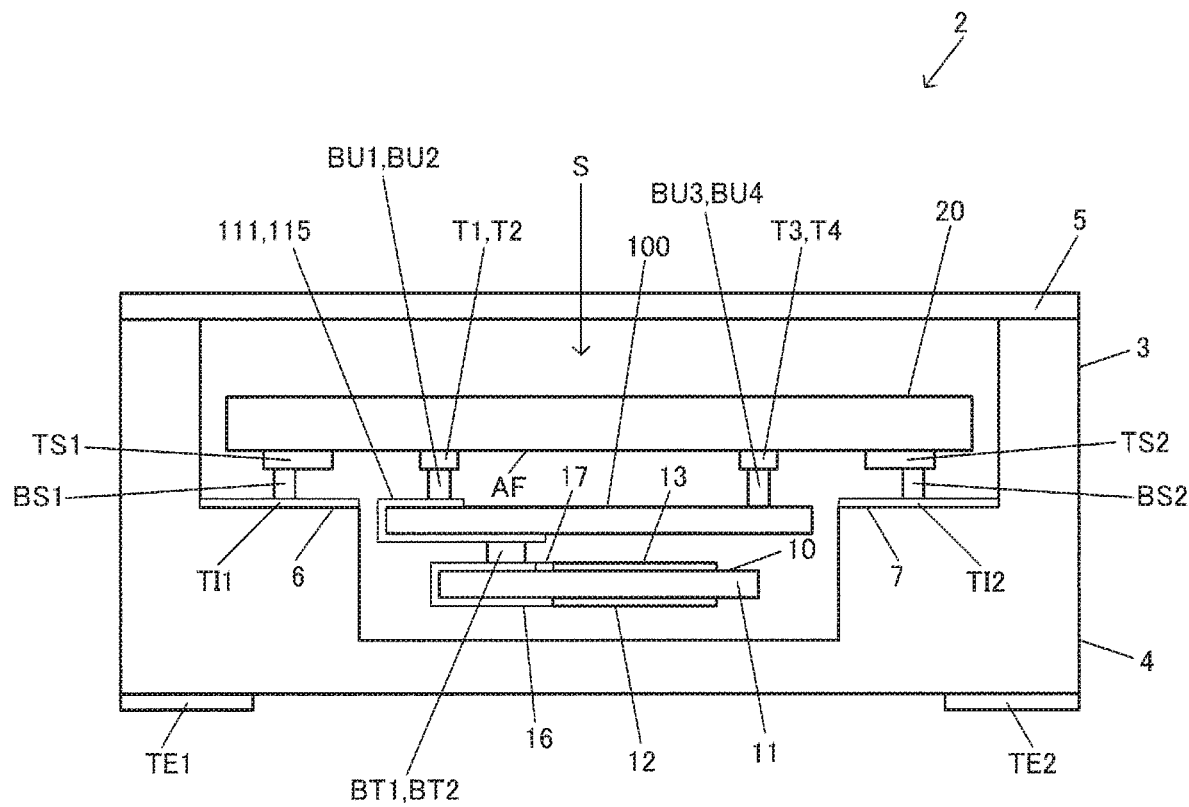
FIG. 10 is another sectional view illustrating a configuration of the resonator device including the integrated circuit device and the resonator.
Figure 10:
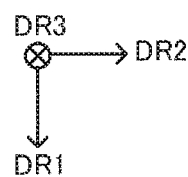

FIG. 9 is another descriptive diagram of the resonator device 2, and FIG. 10 is a sectional view illustrating the resonator device 2 in a state where the resonator device 2 is mounted on the package 3. In the resonator device 2 of the embodiment illustrated in FIG. 9, a relay substrate 100 is disposed between the resonator 10 and the integrated circuit device 20. For example, the resonator 10, the relay substrate 100, and the integrated circuit device 20 are attached to each other as a stack in their thickness direction. A unit in which the resonator 10, the relay substrate 100, and the integrated circuit device 20 are attached to each other as a stack is called the resonator unit 9 (stack body). Wiring 111 for electrically connecting the terminal T1 of the integrated circuit device 20 to the electrode 12 of the resonator 10 and wiring 115 for electrically connecting the terminal T2 of the integrated circuit device 20 to the electrode 13 of the resonator 10 are formed in the relay substrate 100. The wiring 111 and the wiring 115 are electrically connected to terminals of the resonator 10 through conductive bumps BT1 and BT2 that are disposed on the resonator 10 side surface of the relay substrate 100. The terminals of the resonator 10 are connected to the electrodes 12 and 13. Accordingly, the terminals T1 and T2 for driving the integrated circuit device 20 are electrically connected to the electrodes 12 and 13 of the resonator 10. The resonator 10 performs an oscillation operation by applying a drive voltage between the terminals T1 and T2. Accordingly, the relay substrate 100 is a substrate that relays electrical connection between the resonator 10 and the integrated circuit device 20.

The relay substrate 100 has a function of hindering transmission of stress caused by deformation of the integrated circuit device 20 or the package 3 to the resonator 10. For example, the relay substrate 100 can be implemented by a quartz crystal substrate. For example, the relay substrate 100 is formed by patterning the quartz crystal substrate by etching (for example, wet etching). The relay substrate 100 may be implemented by a piezoelectric substrate, a silicon substrate, a resin substrate, a metal substrate, a ceramic substrate, or the like other than the quartz crystal substrate. By interposing the relay substrate 100 between the resonator and the integrated circuit device 20, deformation (stress) caused by heat distortion or the like of the integrated circuit device 20 or the package 3 is not easily transmitted to the resonator 10, and a decrease in the resonating characteristics of the resonator 10 can be reduced.

In addition, in the resonator device 2 in FIG. 9 and FIG. 10, the integrated circuit device 20 includes terminals T3 and T4 (third and fourth terminals) that are not electrically connected to the electrodes 12 and 13 (first and second electrodes) of the resonator 10. The resonator 10 is supported on the active surface AF side of the integrated circuit device 20 using conductive bumps BU1, BU2, BU3, and BU4 disposed in the terminals T1, T2, T3, and T4. Specifically, the resonator 10 is supported on the active surface AF side of the integrated circuit device 20 through the relay substrate 100 that is supported by the conductive bumps BU1, BU2, BU3, and BU4 of the terminals T1, T2, T3, and T4 of the integrated circuit device 20. As illustrated in FIG. 7 to FIG. 10, the number of terminals for supporting the resonator 10 or the relay substrate 100 may be three or may be four. Alternatively, the resonator 10 or the relay substrate 100 may be supported using five or more terminals.

Figure 11:
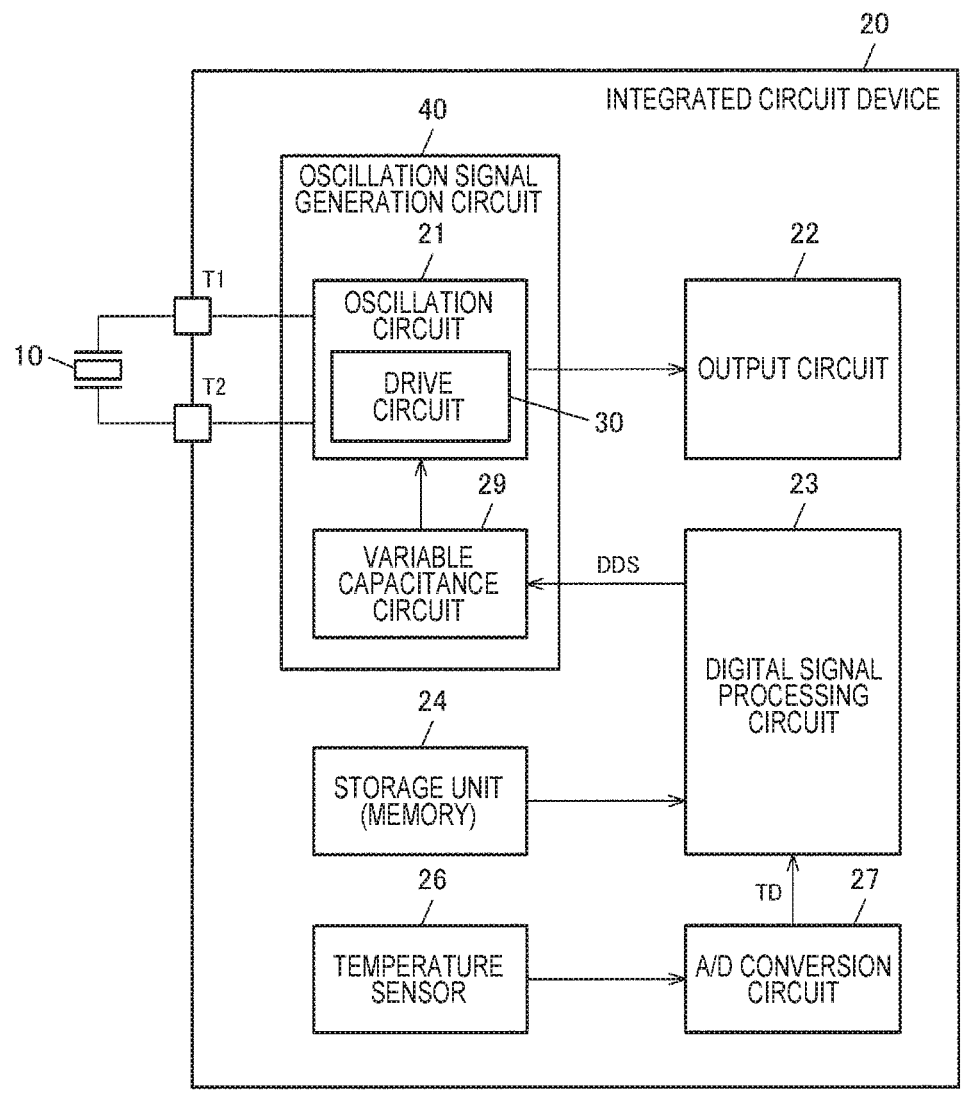
FIG. 11 is a configuration example of the integrated circuit device.

FIG. 11 illustrates a configuration example of the integrated circuit device 20. The integrated circuit device includes an output circuit 22, the digital signal processing circuit 23, the storage unit 24 (memory), the temperature sensors 26, the A/D conversion circuit 27, and the oscillation signal generation circuit 40. In addition, the integrated circuit device 20 includes the terminals T1 and T2. The integrated circuit device 20 is not limited to the configuration in FIG. 11. Various modifications can be made such that a part of the constituents is not included, or another constituent is added.

Each temperature sensor 26 outputs a temperature-dependent voltage as the temperature detection voltage. The temperature-dependent voltage changes depending on the ambient (for example, the integrated circuit device 20 or the resonator 10) temperature. For example, each temperature sensor 26 generates the temperature-dependent voltage using a circuit element having temperature dependence and outputs the temperature-dependent voltage with a temperature-independent voltage (for example, a band gap reference voltage) as a reference. For example, a PN junction forward voltage is output as the temperature-dependent voltage.

The A/D conversion circuit 27 performs A/D conversion on the temperature detection voltage from the temperature sensors 26 and outputs the result of A/D conversion as the temperature detection data TD. For example, a successive comparison type, a flash type, a pipeline type, or a double integral type can be employed as an A/D conversion scheme.

The digital signal processing circuit 23 performs various types of signal processing. For example, the digital signal processing circuit 23 (temperature compensation unit) performs the temperature compensation process of compensating the temperature characteristics of the oscillation frequency of the resonator 10 based on the temperature detection data TD and outputs the frequency control data DDS for controlling the oscillation frequency. Details of the temperature compensation process will be described below.

The digital signal processing circuit 23 can be implemented by a digital signal processor (DSP) that executes various types of signal processing including the temperature compensation process in a time division manner. Alternatively, the digital signal processing circuit 23 may be implemented by an ASIC circuit such as a gate array based on automatic place and route or may be implemented by a processor (for example, a CPU or an MPU) and a program that operates on the processor. In addition, the digital signal processing circuit 23 may perform a correction process (for example, aging correction) other than temperature compensation. In addition, the digital signal processing circuit 23 may control a heater (open control) or the like of the constant temperature chamber in the constant temperature chamber type oscillator (OCXO).

The storage unit 24 stores various data including data for the temperature compensation process. The storage unit 24 may be implemented by a semiconductor memory such as a RAM (SRAM or DRAM) or may be implemented by a non-volatile memory.

The oscillation signal generation circuit 40 includes a D/A conversion circuit 25 and an oscillation circuit 21. The D/A conversion circuit 25 performs D/A conversion on the frequency control data DDS and outputs a control voltage corresponding to the frequency control data DDS to the oscillation circuit 21. The oscillation circuit is a circuit that includes the drive circuit 30 and oscillates the resonator 10 by driving the resonator 10 using the drive circuit 30. It is desirable to dispose a variable capacitance circuit for a connection node of at least one of an output node or an input node of the drive circuit 30. For example, the variable capacitance circuit is a varactor of which the capacitance value changes based on the control voltage from the D/A conversion circuit 25. Various modifications can be made to the oscillation signal generation circuit 40 as will be described below using FIG. 26.

The output circuit 22 (buffer circuit) performs buffering of the oscillation signal generated by the oscillation signal generation circuit 40 (oscillation circuit 21) and outputs a signal after buffering. That is, buffering for sufficiently driving an external load is performed. For example, the signal after buffering is a clipped sine wave signal. The signal may be a rectangular wave signal. Alternatively, the output circuit 22 may be a circuit that can output both of the clipped sine wave signal and the rectangular wave signal.

Next, the arrangement of the temperature sensors 26 in the integrated circuit device 20 will be described. As described above, in the temperature compensation process, the difference between the temperature (temperature detection data TD) detected by the temperature sensors 26 and the temperature of the resonator 10 is a cause of decrease in accuracy. Thus, in the embodiment, the temperature sensors 26 are disposed in the vicinity of the heat conduction path between the integrated circuit device and the resonator 10. Accordingly, the temperature detection data from the temperature sensors 26 is acquired as information that reflects heat conduction between the integrated circuit device 20 and the resonator 10. Thus, an improvement in the accuracy of the temperature compensation process can be expected.

Figure 12:
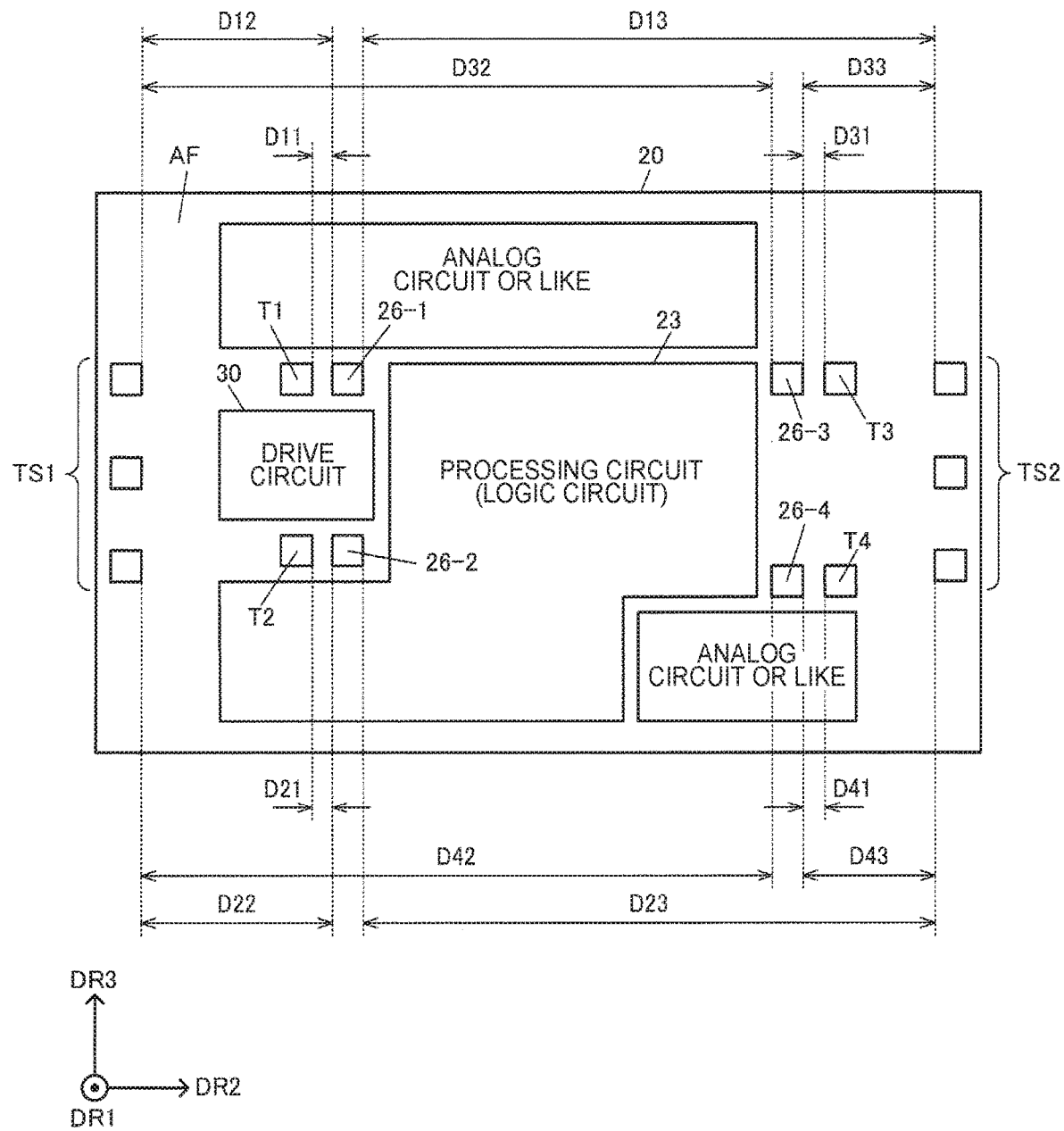
FIG. 12 is a diagram for describing the arrangement of temperature sensors.

FIG. 12 is a diagram for describing the arrangement of the temperature sensors 26. For example, the integrated circuit device 20 includes a first oscillation terminal that is connected to one of the input node or the output node of the drive circuit 30, a second oscillation terminal that is connected to the other of the input node or the output node of the drive circuit 30, a power supply terminal to which a power supply voltage is supplied, and an output terminal from which an oscillation signal is output. The first oscillation terminal corresponds to the terminal T1, and the second oscillation terminal corresponds to the terminal T2. In addition, the power supply terminal and the output terminal are terminals included in the terminal TS1 or TS2.

As illustrated in FIG. 12, the first temperature sensor 26-1 included in the integrated circuit device 20 is arranged at a position closer to T1 than any terminal of TS1 or TS2. That is, a distance D11 between the first temperature sensor 26-1 and the first oscillation terminal T1 is smaller than a distance D12 between the first temperature sensor 26-1 and TS1 and a distance D13 between the first temperature sensor 26-1 and TS2. That is, the distance between the first temperature sensor 26-1 and the first oscillation terminal is smaller than at least one of the distance between the first temperature sensor 26-1 and the power supply terminal or the distance between the first temperature sensor 26-1 and the output terminal. The distance between the first temperature sensor 26-1 and the first oscillation terminal, the distance between the first temperature sensor 26-1 and the power supply terminal, and the distance between the first temperature sensor 26-1 and the output terminal refer to the shortest distance between the first temperature sensor 26-1 and the first oscillation terminal, the shortest distance between the first temperature sensor 26-1 and the power supply terminal, and the shortest distance between the first temperature sensor 26-1 and the output terminal, respectively. In addition, the second temperature sensor 26-2 is arranged at a position closer to T2 than any terminal of TS1 or TS2. That is, a distance D21 between the second temperature sensor 26-2 and the second oscillation terminal T2 is smaller than a distance D22 between the second temperature sensor 26-2 and TS1 and a distance D23 between the second temperature sensor 26-2 and TS2. That is, the distance between the second temperature sensor 26-2 and the second oscillation terminal is smaller than at least one of the distance between the second temperature sensor 26-2 and the power supply terminal or the distance between the second temperature sensor 26-2 and the output terminal. The distance between the second temperature sensor 26-2 and the second oscillation terminal, the distance between the second temperature sensor 26-2 and the power supply terminal, and the distance between the second temperature sensor 26-2 and the output terminal refer to the shortest distance between the second temperature sensor 26-2 and the second oscillation terminal, the shortest distance between the second temperature sensor 26-2 and the power supply terminal, and the shortest distance between the second temperature sensor 26-2 and the output terminal, respectively. FIG. 12 illustrates an example in which the distance between the first temperature sensor 26-1 and the first oscillation terminal is smaller than any of the distance between the first temperature sensor 26-1 and the output terminal or the distance between the first temperature sensor 26-1 and the power supply terminal. Similarly, FIG. 12 illustrates an example in which the distance between the second temperature sensor 26-2 and the second oscillation terminal is smaller than any of the distance between the second temperature sensor 26-2 and the output terminal or the distance between the second temperature sensor 26-2 and the power supply terminal.

As illustrated in FIG. 7 to FIG. 10, T1 and T2 (BU1 and BU2) are members supporting the resonator 10 or the relay substrate 100 and constitute the heat conduction path between the integrated circuit device 20 and the resonator 10. Thus, by disposing the temperature sensors 26 (26-1 and 26-2) at a position relatively closer to T1 or a position closer to T2 with respect to other terminals (TS1 and TS2), a high accuracy temperature compensation process can be implemented. Particularly, since T1 and T2 are terminals necessary for driving the resonator 10, the likelihood that T1 and T2 constitute the heat conduction path is significantly high, and it is important to dispose the temperature sensors 26 in the vicinity of T1 and T2. While the embodiment is configured such that the distance between the first temperature sensor 26-1 and the first oscillation terminal is smaller than any of the distance between the first temperature sensor 26-1 and the output terminal or the distance between the first temperature sensor 26-1 and the power supply terminal, the accuracy of the temperature compensation process can be improved as long as the distance between the first temperature sensor 26-1 and the first oscillation terminal is smaller than one of the distance between the first temperature sensor 26-1 and the output terminal or the distance between the first temperature sensor 26-1 and the power supply terminal. The same applies to the second temperature sensor 26-2.

In addition, the integrated circuit device 20 includes a support terminal. The support terminal may be the terminal T3 in which an electrode for supporting the resonator 10 is formed in FIG. 7, or may be the terminals T3 and T4 in which electrodes for supporting the relay substrate 100 are formed in FIG. 9.

As illustrated in FIG. 12, a third temperature sensor 26-3 is arranged at a position closer to T3 than any terminal of TS1 or TS2. That is, a distance D31 between the third temperature sensor 26-3 and the support terminal T3 is smaller than a distance D32 between the third temperature sensor 26-3 and TS1 and a distance D33 between the third temperature sensor 26-3 and TS2. That is, the distance between the third temperature sensor 26-3 and the support terminal is smaller than at least one of the distance between the third temperature sensor 26-3 and the power supply terminal or the distance between the third temperature sensor 26-3 and the output terminal. The distance between the third temperature sensor 26-3 and the support terminal, the distance between the third temperature sensor 26-3 and the power supply terminal, and the distance between the third temperature sensor 26-3 and the output terminal refer to the shortest distance between the third temperature sensor 26-3 and the support terminal, the shortest distance between the third temperature sensor 26-3 and the power supply terminal, and the shortest distance between the third temperature sensor 26-3 and the output terminal, respectively.

While the terminal T3 is a terminal that is not used in electrical connection, the terminal T3 supports the resonator 10 or the relay substrate 100. Thus, since T3 also constitutes the heat conduction path, the temperature sensors 26 may be disposed in the vicinity of T3. FIG. 12 illustrates an example in which the integrated circuit device 20 includes a fourth temperature sensor 26-4 that is arranged at a position closer to T4 than any terminal of TS1 or TS2. While the embodiment is configured such that the distance between the third temperature sensor 26-3 and the support terminal is smaller than any of the distance between the third temperature sensor 26-3 and the output terminal or the distance between the third temperature sensor 26-3 and the power supply terminal, the accuracy of the temperature compensation process can be improved as long as the distance between the third temperature sensor 26-3 and the support terminal is smaller than one of the distance between the third temperature sensor 26-3 and the output terminal or the distance between the third temperature sensor 26-3 and the power supply terminal. The same applies to the fourth temperature sensor 26-4. In a case where a plurality of support terminals are disposed, each support terminal may constitute the heat conduction path. Thus, by disposing the temperature sensors 26 in the vicinity of each support terminal, an improvement in the accuracy of the temperature compensation process can be expected. Various modifications can be made such that the fourth temperature sensor 26-4 is not included.

3. Calculation Process for Frequency Control Data

Next, the temperature compensation process according to the embodiment, that is, a calculation process for the frequency control data DDS, will be described. First, an outline of the neural network calculation will be described, and then, a method of the embodiment will be described.

3.1 Outline of Neural Network Calculation

Figure 13:
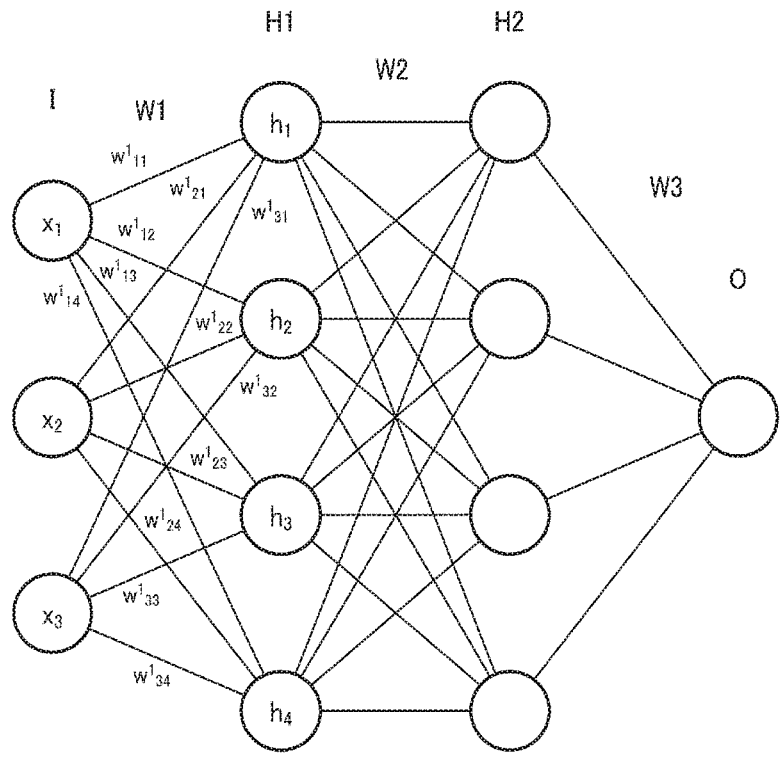
FIG. 13 is a descriptive diagram of a neural network.

FIG. 13 is a basic structure example of the neural network. The neural network is a mathematical model that simulates brain functions on a computer. One circle (node) in FIG. 13 is called a neuron. In the example in FIG. 13, the neural network includes an input layer (I), two hidden layers (H1 and H2), and an output layer (O). The number of neurons in the input layer is three. The number of neurons in each hidden layer is four. The number of neurons in the output layer is one. Various modifications can be made to the number of hidden layers (intermediate layers) or the number of neurons included in each layer. Each neuron included in the input layer is coupled to the neurons in the first hidden layer (H1). The neurons included in the first hidden layer are coupled to the neurons in the second hidden layer (H2), and the neurons included in the second hidden layer are coupled to the neuron in the output layer.

The input layer includes neurons, each of which outputs an input value. In the example in FIG. 13, the neural network receives x1, x2, and x3 as input and the neurons in the input layer output x1, x2, and x3, respectively. Any type of preprocessing may be performed on the input value, and each neuron in the input layer may output the value after preprocessing.

In each neuron from the hidden layers (intermediate layers), calculation that imitates a state where information as an electric signal is transmitted in a brain is performed. In the brain, the transmittability of information changes depending on the coupling strength between synapses. Thus, the coupling strength is denoted by a weight W in the neural network.

In FIG. 13, W1 is the weight between the input layer and the first hidden layer. W1 denotes a set of weights between a given neuron included in the input layer and a given neuron included in the first hidden layer. In a case where the weight between a p-th neuron in the input layer and a q-th neuron in the first hidden layer is denoted by w1pq, W1 in FIG. 13 is information that includes 12 weights of w111 to w134. In a wider sense, the weight W1 is information that includes the number of weights corresponding to the product of the number of neurons in the input layer and the number of neurons in the first hidden layer.

In the first neuron in the first hidden layer, calculation illustrated in Expression (1) is performed. That is, in one neuron, a multiply-accumulate calculation is performed on the outputs of the neurons in the immediately previous layer connected to the neuron, and calculation of adding a bias (b1) is performed.

$$h_1 = f\left(\sum_i w_{i1}^1 \cdot x_i + b_1\right) \quad (1)$$

In addition, as illustrated in Expression (1), in the calculation in one neuron, an activation function f that is a non-linear function is used. For example, the activation function f uses a ReLU function illustrated in Expression (2). The ReLU function is a function of which the value is equal to zero in a case where a variable is smaller than or equal to zero, and is equal to the variable in a case where the variable is greater than zero. It is known that various functions can be used as the activation function f. A sigmoid function may be used, or a function acquired by improving the ReLU function may be used. While a calculation expression for h1 is illustrated in Expression (1), the same calculation may be performed in other neurons in the first hidden layer.

$$f(x) = \max(0, x) = \begin{cases} 0 \ (x \le 0) \\ x \ (x \ge 0) \end{cases} \quad (2)$$

In addition, the same applies to the subsequent layers. For example, in a case where the weight between the first hidden layer and the second hidden layer is denoted by W2, a multiply-accumulate calculation that uses the output of the first hidden layer and the weight W2, and calculation of adding a bias and applying the activation function are performed in the neurons in the second hidden layer.

In the neuron in the output layer, calculation of weighting and adding the output of the immediately previous layer (in the example in FIG. 13, the second hidden layer) and adding a bias is performed. In the neural network, the result of the calculation in the output layer is the output of the neural network. Alternatively, the result of any type of postprocessing performed on the result of the calculation in the output layer may be output.

As is understood from the above description, an appropriate weight and an appropriate bias need to be set (learned) in order to acquire a desired output from the input. In the learning, multiple sets of a given input x and a correct output t (training data) of the input are prepared. The learning process of the neural network can be considered as a process of obtaining the most reliable weight and the most reliable bias for the multiple training data. Backpropagation is widely known as the learning process of the neural network.

Figure 14:
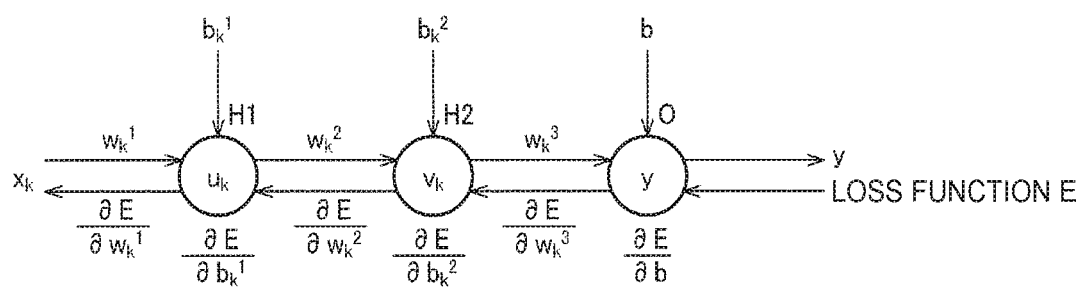
FIG. 14 is a descriptive diagram of backpropagation.

FIG. 14 is a diagram for describing the backpropagation. In FIG. 14, a process that is focused on one neuron in each of the first hidden layer, the second hidden layer, and the output layer is illustrated for simplification of description. In the backpropagation, parameters (the weight and the bias) are updated by repeating a forward pass and a backward pass. First, an output y is calculated using the input x and the weight and the bias at that point of time. The initial values of the weight and the bias can be set in various manners. In the example in FIG. 14, calculation in Expressions (3) to (5) is performed, and y is calculated from xk. In Expressions (3) to (5), u denotes the output of the first hidden layer, and v denotes the output of the second hidden layer.

$$y = \sum_{k=1}^{n} (w_k^3 \cdot v_k) + b \qquad (3)$$

$$v = f\left(\sum_{k=1}^{n} (w_k^2 + u_k) + b^2\right) \qquad (4)$$

$$u = f\left(\sum_{k=1}^{n} (w_k^1 \cdot x_k) + b^1\right) \qquad (5)$$

A loss function E is obtained based on the obtained output y and training data t corresponding to the input x. For example, the loss function E is in Expression (6). The loss function E may be a simple difference (y−t), or other loss functions may be used. A process performed up to the obtaining of the loss function E is called a forward pass.

$$E = \frac{1}{2}(y - t)^2 \qquad (6)$$

After the loss function E is obtained by the forward pass, each parameter is updated using a partial derivative of the loss function E as illustrated in Expressions (7) to (12). In Expressions (7) to (12), a value that is suffixed with "+1" denotes a value after the update process. For example, b+1 denotes the value of b after the update process. In addition, η denotes a learning rate. It is desirable that the learning rate is not constant and is changed depending on the status of learning.

$$b_{+1} = b - \eta \frac{\partial E}{\partial b} \qquad (7)$$

$$w_{k+1}^3 = w_k^3 - \eta \frac{\partial E}{\partial w_k^3} \qquad (8)$$

$$b_{k+1}^2 = b_k^2 - \eta \frac{\partial E}{\partial b_k^2} \qquad (9)$$

$$w_{k+1}^2 = w_k^2 - \eta \frac{\partial E}{\partial w_k^2} \qquad (10)$$

$$b_{k+1}^1 = b_k^1 - \eta \frac{\partial E}{\partial b_k^1} \qquad (11)$$

$$w_{k+1}^1 = w_k^1 - \eta \frac{\partial E}{\partial w_k^1} \qquad (12)$$

At this point, the partial derivative of the loss function E related to each parameter is calculated from the output layer toward the input layer using a chain rule. Specifically, each partial derivative illustrated in Expressions (7) to (12) can be easily obtained by sequentially calculating Expressions (13) to (18). In addition, in a case where the ReLU function in Expression (2) is used as the activation function f, the derivative value is either zero or one. Thus, the partial derivative is easily calculated. A series of processes that use Expressions (7) to (18) is called a backward pass.

$$\frac{\partial E}{\partial b} = \frac{\partial E}{\partial y} \cdot \frac{\partial y}{\partial b} = (y - t) \qquad (13)$$

$$\frac{\partial E}{\partial w_k^3} = \frac{\partial E}{\partial y} \cdot \frac{\partial y}{\partial w_k^3} = (y - t) \cdot v_k \qquad (14)$$

$$\frac{\partial E}{\partial b_k^2} = \frac{\partial E}{\partial y} \cdot \frac{\partial y}{\partial v_k} \cdot \frac{\partial v_k}{\partial b_k^2} = (y - t) \cdot w_k^3 \cdot f'(v_k) \qquad (15)$$

$$\frac{\partial E}{\partial w_k^2} = \frac{\partial E}{\partial y} \cdot \frac{\partial y}{\partial v_k} \cdot \frac{\partial v_k}{\partial w_k^2} = (y - t) \cdot w_k^3 \cdot f'(v_k) \cdot u_k \qquad (16)$$

$$\frac{\partial E}{\partial b_k^1} = \frac{\partial E}{\partial y} \cdot \frac{\partial y}{\partial v_k} \cdot \frac{\partial v_k}{\partial u_k} \cdot \frac{\partial u_k}{\partial b_k^1} = (y - t) \cdot w_k^3 \cdot f'(v_k) \cdot w_k^2 \cdot f'(u_k) \qquad (17)$$

$$\frac{\partial E}{\partial w_k^1} = \frac{\partial E}{\partial y} \cdot \frac{\partial y}{\partial v_k} \cdot \frac{\partial v_k}{\partial u_k} \cdot \frac{\partial u_k}{\partial w_k^1} = (y - t) \cdot w_k^3 \cdot f'(v_k) \cdot w_k^2 \cdot f'(u_k) \cdot x_k \qquad (18)$$

In the learning process, the forward pass and the backward pass are repeatedly executed until it is determined that the parameters converge. In a case where the neural network calculation is applied to the temperature compensation process, the values of the weight and the bias are learned such that appropriate frequency control data DDS corresponding to temperature is output. The result of learning is stored in the storage unit 24 (memory). When the temperature compensation process is executed (when an estimation process is performed), calculation illustrated in Expression (1) is performed based on input data and the stored parameters, and calculation of obtaining the frequency control data DDS as output data is performed.

3.2 Neural Network Calculation of Embodiment

In the embodiment, a higher accuracy temperature compensation process is performed. Thus, the frequency control data DDS is obtained using the neural network that takes the temperature detection data TD1 to TDN from the first to N-th temperature sensors 26 and the amount of change in time of the temperature detection data TD as input. In addition, in the embodiment, a high accuracy temperature compensation process is implemented with a reduced number of neurons by combining polynomial approximation (least squares method) with the neural network calculation. However, not all the temperature detection data TD1 to TDN from the first to N-th temperature sensors 26 need to be used. The temperature detection data from a single temperature sensor may be used.

Specifically, in a case where the temperature detection data of the first to N-th temperature sensors 26 are denoted by TD1 to TDN, input candidates are the amount of change in time of the temperature detection data and the repeatedly multiplied temperature detection data. In the case of the temperature detection data TD1 of the first temperature sensor 26 (26-1), the input candidates are not only TD1 but also TD1^2, TD1^3, . . . , TD1^M, and ΔTD1. The amount of change in time of TD1 is denoted by ΔTD1. For example, ΔTD1 is the difference in value between TD1 at a given timing (the most recent timing) and TD1 at a timing in the past (the immediately previous timing). Similarly, in the case of the i-th temperature detection data TDi, the input candidates are TDi, TDi^2, ..., TDi^M, and ΔTDi. That is, in the embodiment, M+1 pieces of data can be used as input for one temperature sensor 26, and total N×(M+1) pieces of data can be used as input.

While N is, for example, approximately six, and M is, for example, approximately five, various modifications can be made to the number of temperature sensors 26 or the upper limit value of the exponent. In addition, the amount of change in time is not limited to the difference in value between the most recent two timings. The difference between the most recent timing and the second previous or earlier timing may be set as the amount of change in time. The average value or the like of a plurality of differences in value may be set as the amount of change in time. The result of a filter process performed on the difference in value may be set as the amount of change in time. In addition, the number of amounts of change in time set as the input candidates is not limited to one. A plurality of amount of change in time may be set as the input candidates among the above various amounts of change in time.

In the neural network calculation of the digital signal processing circuit 23, all of the input candidates may be used as input. However, in a case where the number of inputs is increased, the number of pieces of data included in the weight W1 between the input layer and the first hidden layer is increased. Thus, the amount of data stored in the storage unit 24 is increased. Thus, a part of the input candidates may be used as the input of the neural network. Hereinafter, data that is selected as the input of the neural network among the input candidates will be referred to as input data Xin. In order to improve the accuracy of the temperature compensation process, it is necessary to satisfy at least one of inclusion of data based on two or more pieces of temperature detection data in the input data Xin, or inclusion of one or more amounts of change in time in the input data Xin. Considering accuracy, it is desirable to satisfy both conditions.

The learning process of the neural network in the embodiment will be described. First, in the inspection step, a temperature sweep is performed in the constant temperature chamber, and actual measurement data is acquired. For example, the temperature sweep is performed within a range of −40° C. to 125° C. as illustrated in FIG. 4.

Figure 15:
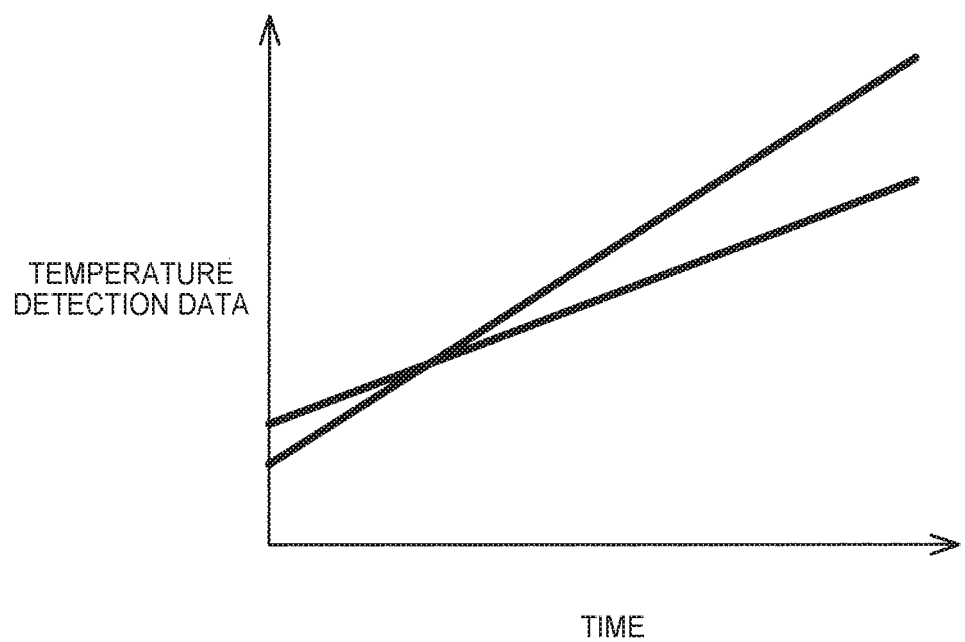
FIG. 15 is an example of change in time of temperature detection data measured in the inspection step.

FIG. 15 is a graph representing a change in time of the temperature detection data TD1 to TDN of the first to N-th temperature sensors 26 actually measured in the inspection step. In FIG. 15, a horizontal axis denotes time, and a vertical axis denotes the value of the temperature detection data. FIG. 15 illustrates two pieces of temperature detection data for simplification of description.

FIG. 15 corresponds to an example in which the temperature sweep that changes the constant temperature chamber from a low temperature to a high temperature is performed. The temperature detection data of each temperature sensor 26 is increased along with time. However, since the temperature detection data is affected by the position of the heat source, the position at which each temperature sensor 26 is arranged, the heat conduction path, and the like, specific values (waveforms) of given temperature detection data and another temperature detection data are different from each other.

In a case where a change in time of the temperature detection data TD is known as in FIG. 15, a change in time of the input data Xin of the neural network can be obtained. Specifically, repeated multiplication data is obtained by repeatedly multiplying the temperature detection data at each timing. In addition, the amount of change in time is obtained by calculating the derivative of the graph in FIG. 15 (obtaining the difference between adjacent data). That is, a change in time of the input data Xin can be obtained based on the actually measured temperature detection data TD.

Figure 16:
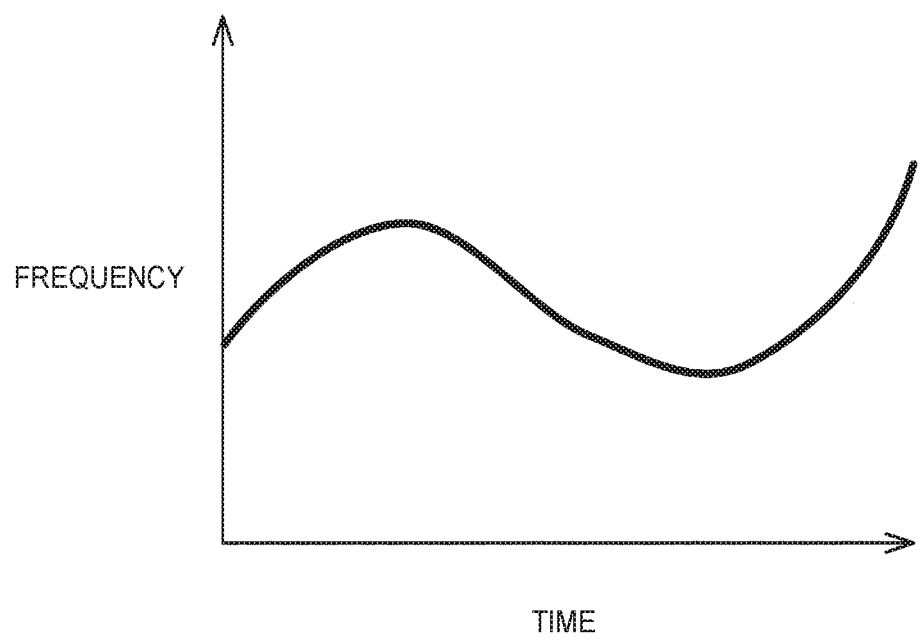
FIG. 16 is an example of change in time of the frequency of an oscillation signal actually measured in the inspection step.

In addition, in the inspection step, the frequency of the oscillation signal (the oscillation frequency of the resonator 10) output by the oscillation signal generation circuit 40 during the temperature sweep is measured. FIG. 16 is a graph representing a change in time of the frequency of the oscillation signal actually measured in the inspection step. The frequency control data DDS for outputting an oscillation signal of a desired frequency can be obtained by combining the actually measured information in FIG. 16 with the temperature characteristics of the oscillation signal generation circuit 40 (for example, the temperature characteristics of the varactor illustrated in FIG. 2). That is, a change in time of the frequency control data DDS can be obtained based on the actually measured data. The temperature characteristics of the varactor may be measured during the temperature sweep or may be separately measured.

As described above, the mutual relationship among the temperature detection data TD, the input data Xin, the oscillation frequency, and the frequency control data DDS can be obtained using data actually measured in the inspection step and a calculation process based on the data.

In the embodiment, the relationship between the input data Xin and the frequency control data DDS is used in the learning process. In the learning process, the accuracy of learning can be increased by preparing multiple pieces of training data. Thus, a plurality of pieces of learning data may be extracted from data that is acquired in one temperature sweep. In addition, considering heat conduction, the temperature sweep may not be performed once, and a plurality of temperature sweeps may be performed.

For example, the learning process is performed by an information processing apparatus (PC or the like) that is different from the integrated circuit device 20 according to the embodiment. In the embodiment, the learning process of the neural network may be performed using the input data Xin and the frequency control data DDS. In the case of performing such a learning process, the frequency control data DDS is directly calculated by the neural network calculation process.

However, the embodiment combines polynomial approximation with the neural network, considering a decrease in the number of neurons. Specifically, a brief temperature compensation process is performed based on polynomial approximation, and an error that cannot be compensated by polynomial approximation is compensated by the neural network calculation.

Figure 17:
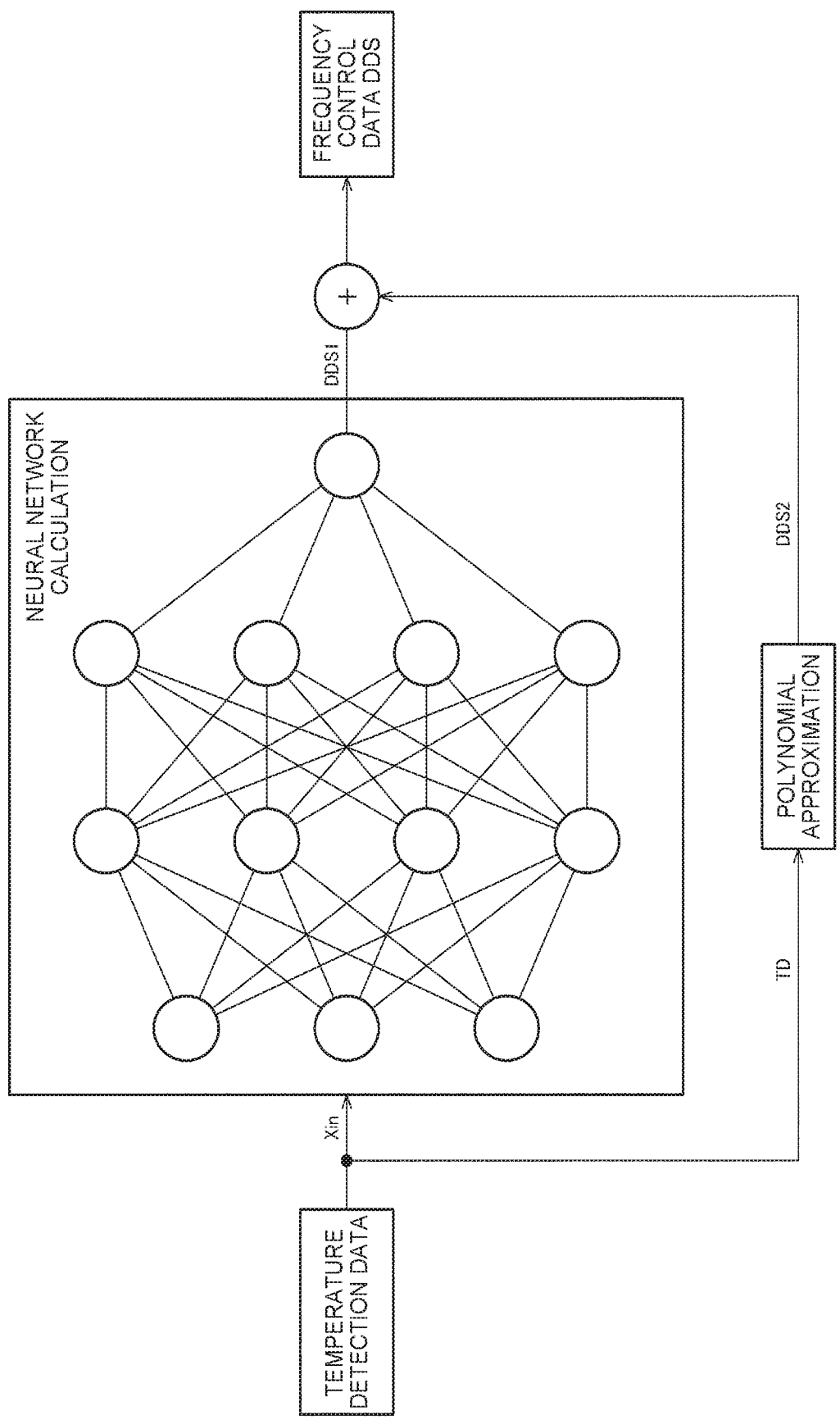
FIG. 17 is a diagram for describing the temperature compensation process of the present embodiment.

FIG. 17 is a schematic diagram for describing the flow of temperature compensation process in the embodiment. The digital signal processing circuit 23 of the embodiment obtains first frequency control data DDS1 by performing the neural network calculation that takes the input data Xin based on the plurality of pieces of temperature detection data TD1 to TDN as input, and obtains second frequency control data DDS2 by performing polynomial approximation that takes given temperature detection data as input. The digital signal processing circuit 23 outputs the sum of the first frequency control data DDS1 and the second frequency control data DDS2 as the final frequency control data DDS to the oscillation signal generation circuit 40.

The neural network in the example in FIG. 17 needs to learn the weight and the bias such that the first frequency control data DDS1 is output based on the input data Xin. That is, the frequency control data DDS corresponding to the input data Xin cannot be used as the training data, and the first frequency control data DDS1 corresponding to the input data Xin has to be used as the training data.

Thus, in the learning process, first, the relationship between the temperature detection data TD and the frequency control data DDS is subjected to polynomial approximation using the least squares method, and a coefficient of the polynomial is determined. The polynomial approximation may have a certain degree of accuracy. For example, a cubic polynomial is used. In addition, the temperature detection data TD as a variable of the polynomial may be any of the first to N-th temperature detection data TD1 to TDN or may be a statistical quantity such as an average value.

After the coefficient of the polynomial is obtained, the frequency control data (second frequency control data DDS2) based on the polynomial approximation is obtained using the temperature detection data TD and the polynomial. The difference between the frequency control data DDS obtained based on the actual measurement data (FIG. 16) and the second frequency control data DDS2 based on the polynomial approximation is the training data of the first frequency control data DDS1 to be output by the neural network. Thus, in the learning process, with the difference as training data, the weight and the bias are learned by backpropagation or the like described above using FIG. 14.

After the learning is completed, the coefficient of the polynomial in the polynomial approximation and the weight and the bias in the neural network calculation are written into the storage unit 24 (non-volatile memory) as the parameters of the temperature compensation process.

Figure 18:
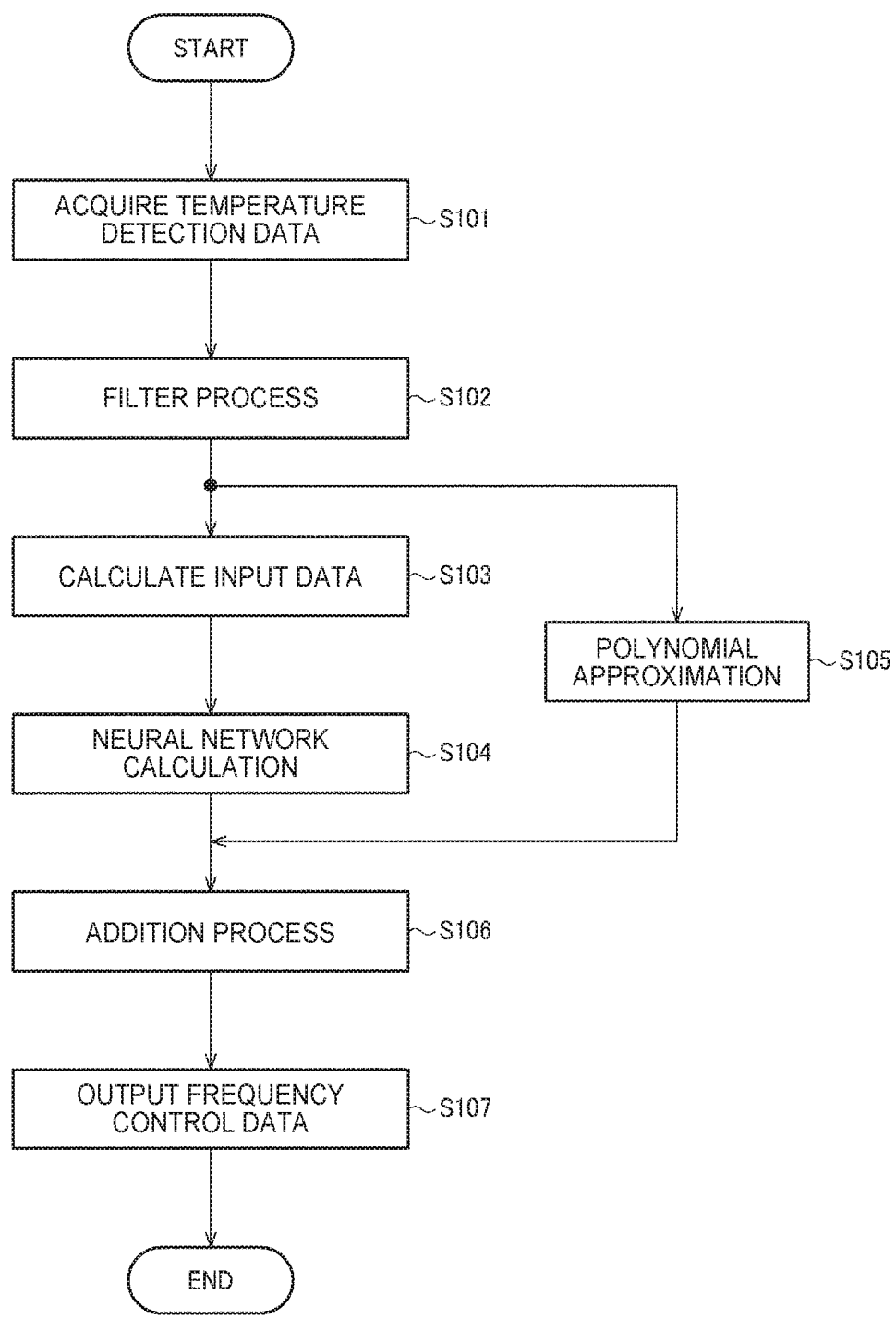
FIG. 18 is a flowchart for describing the temperature compensation process.

FIG. 18 is a flowchart for describing the temperature compensation process executed by the integrated circuit device 20 (digital signal processing circuit 23) according to the embodiment. In a case where the process is started, the digital signal processing circuit 23 acquires the first to N-th temperature detection data TD1 to TDN from the first to N-th temperature sensors 26 (S101) and performs a noise reduction filter process (S102). Modifications can be made such that the filter process is not performed, or another noise reduction process is performed.

Next, the digital signal processing circuit 23 performs a process of obtaining the first frequency control data DDS1 by the neural network calculation, and a process of obtaining the second frequency control data DDS2 by polynomial approximation. In the learning stage, since the result of polynomial approximation is used in the calculation (calculation of difference) of the training data of the neural network, the coefficient of the polynomial approximation needs to be calculated first. However, in a stage where calculation of the necessary parameters (the coefficient, the weight, and the bias) is completed, the order of the neural network calculation and the polynomial approximation is not limited. Any of the neural network calculation or the polynomial approximation may be performed first, or the neural network calculation and the polynomial approximation may be executed in parallel.

In the neural network calculation, a process of obtaining the input data Xin based on the first to N-th temperature detection data TD1 to TDN is performed (S103). As described above, this process is calculation of repeated multiplication and calculation of the amount of change in time. The neural network calculation is performed with the calculated input data Xin as input in accordance with the weight and the bias acquired by the learning process (S104). In the neural network, the number of neurons in the output layer is one, and the first frequency control data DDS1 is output.

In addition, the digital signal processing circuit performs polynomial approximation that takes given temperature detection data TD based on the temperature detection data TD1 to TDN acquired in S101 as the input (variable) of the polynomial, and obtains the second frequency control data DDS2 (S105).

A process of adding the first frequency control data DDS1 obtained in S104 and the second frequency control data DDS2 obtained in S105 is performed (S106), and the result of addition is output as the frequency control data DDS to the oscillation signal generation circuit 40 (S107).

4. Process of Estimating Temperature of Resonator

As described above, in the temperature compensation process, a difference between the temperature detection data TD detected by the temperature sensors 26 and the actual temperature of the resonator 10 is a cause of decrease in accuracy. Thus, in the embodiment described above, the temperature compensation process in which the effect of heat conduction is considered is performed by arranging the plurality of temperature sensors 26 or obtaining the amount of change in time of the temperature detection data TD.

However, in a case where the difference between the temperature detection data TD and the temperature of the resonator 10 is the problem, it is considered that the temperature compensation process can be implemented with high accuracy by estimating the temperature of the resonator 10 based on the temperature detection data TD. That is, the temperature of the resonator 10 is estimated, and the polynomial approximation and the neural network calculation are performed based on the result of estimation (hereinafter, referred to as a temperature estimation value).

4.1 Heat Conduction Model

Figure 19:
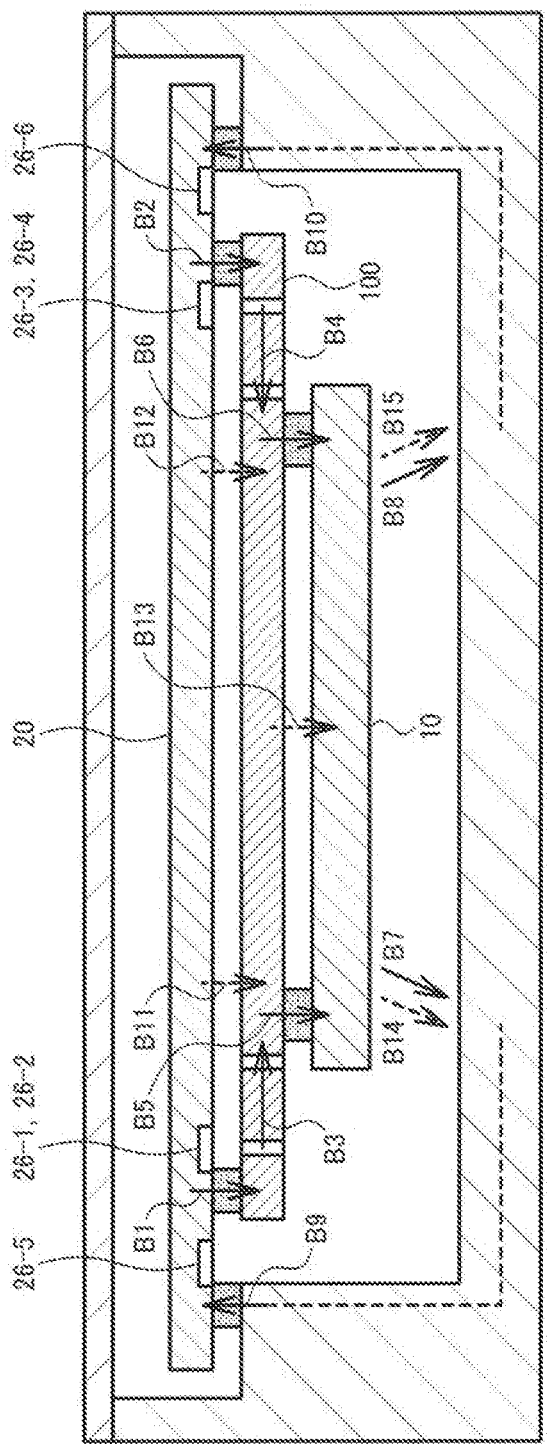
FIG. 19 is a diagram for describing a heat conduction path of the resonator device (oscillator).

First, a heat conduction model for obtaining the temperature estimation value from the temperature detection data will be described. FIG. 19 is a diagram for describing the heat conduction path of the resonator device 2 (oscillator). As described above using FIG. 9 and FIG. 10, the integrated circuit device 20 is supported by the package 3 using the terminals TS1 and TS2 (BS1 and BS2). In addition, the integrated circuit device 20 supports the relay substrate 100 using the terminals T1 to T4 (BU1 to BU4), and the relay substrate 100 supports the resonator 10 in BT1 and BT2.

In FIG. 19, a heat conduction path is illustrated by B1 to B10, and a heat emission (radiation) path is illustrated by B11 to B15. As illustrated in FIG. 19, terminals that are used for connection constitute a main heat conduction path among the package 3, the integrated circuit device 20, the relay substrate 100, and the resonator 10. As described above using FIG. 12, the temperature sensors 26 (26-1 to 26-4) are disposed in the vicinity of the terminals T1 to T4. In addition, another temperature sensor 26 not illustrated in FIG. 12 may be added. FIG. 19 illustrates an example in which the temperature sensors 26 (26-5 and 26-6) are disposed in the vicinity of the heat conduction path between the package 3 and the integrated circuit device 20.

Figure 20:
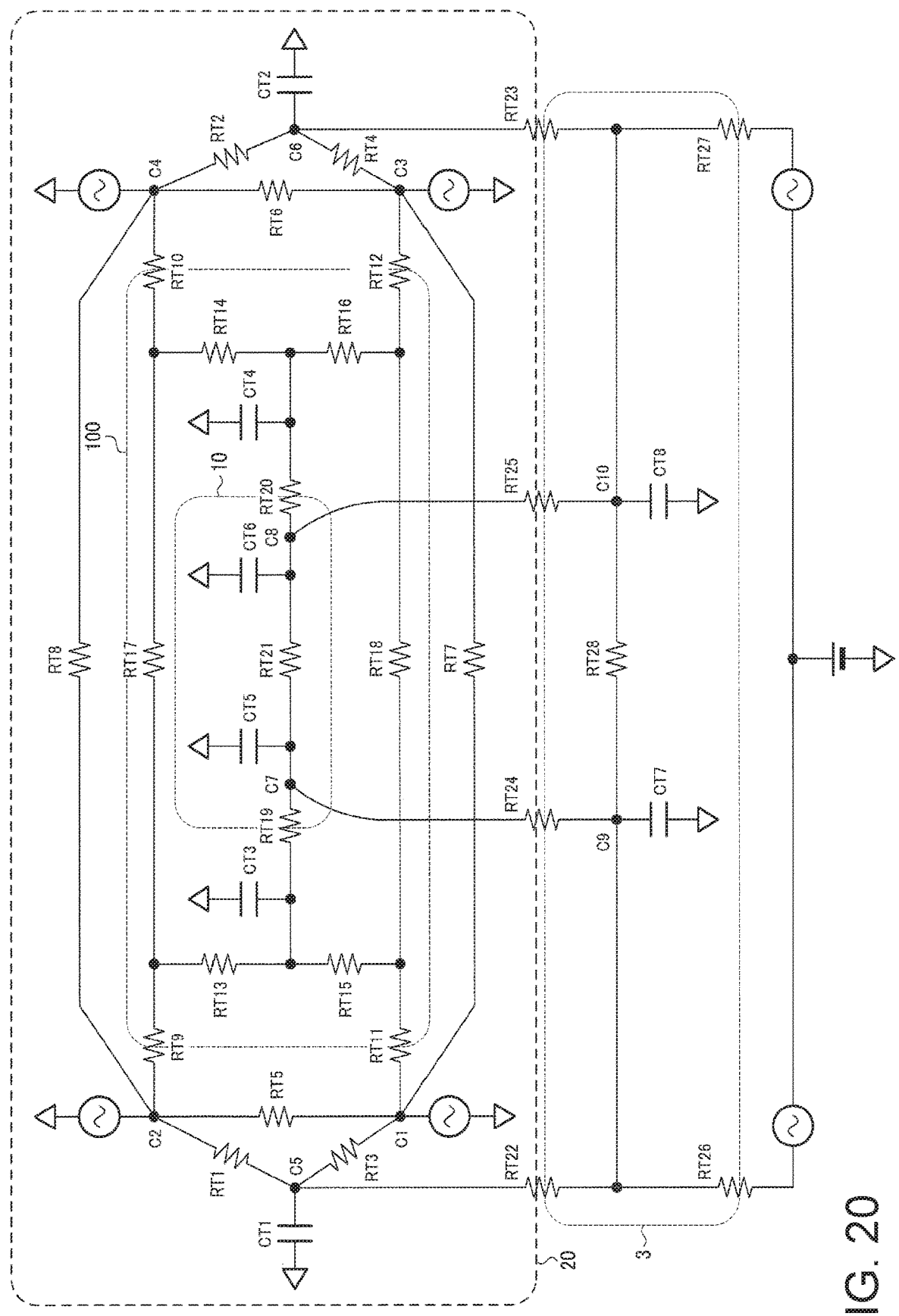
FIG. 20 is an example of a heat conduction model of the resonator device (oscillator).

FIG. 20 is an example of a heat conduction model corresponding to FIG. 19. It is known that heat conduction can be modeled as a heat circuit that includes heat resistances and heat capacitances. In FIG. 20, C1 to C6 are nodes corresponding to the temperature sensors 26-1 to 26-6, respectively, and the temperature detection data TD of each temperature sensor 26 corresponds to the electric potential of the node. In addition, C7 and C8 are nodes on the resonator 10, and the electric potential of C7 or C8 corresponds to the temperature (temperature estimation value) of the resonator 10.

The unit heat capacitance and the unit heat resistance are determined depending on substances. Thus, the resistance value of each heat resistance (RT1 to RT28) and the capacitance value of each heat capacitance (CT1 to CT8) in the circuit in FIG. 20 are determined based on a specific structure (the material, the length, the sectional area, and the like of each member) of the oscillator. In the example in FIG. 20, RT1 to RT8 are heat resistances of which the resistance values are determined by the characteristics of the integrated circuit device 20. In addition, RT9 to RT12 are heat resistances of which the resistance values are determined by the characteristics of the connection part between the integrated circuit device 20 and the relay substrate 100. The same applies to the other heat resistances. RT13 to RT18 correspond to the relay substrate 100. RT19 and RT20 correspond to the connection part between the relay substrate 100 and the resonator 10. RT21 is a heat resistance corresponding to the resonator 10. RT22 to RT25 correspond to the connection part or heat radiation between the integrated circuit device 20 and the package 3. RT26 and RT27 correspond to the part between the package 3 and the outside. RT28 is a heat resistance corresponding to the package 3. In addition, CT1 and CT2 are heat capacitances corresponding to the integrated circuit device 20. CT3 and CT4 are heat capacitances corresponding to the relay substrate 100. CT5 and CT6 are heat capacitances corresponding to the resonator 10. CT7 and CT8 are heat capacitances corresponding to the package 3.

As described above, the resistance value or the capacitance value of each element of the heat circuit can be determined in advance. Thus, by determining the electric potential of each node of C1 to C6 based on the temperature detection data TD (TD1 to TD6) and performing a circuit simulation process, the electric potential of C7 or C8, that is, the temperature estimation value, can be obtained.

However, the circuit simulation process has a high process load. Thus, it is not easy to execute the circuit simulation process in the digital signal processing circuit 23 during the operation of the integrated circuit device 20 (oscillator). Thus, the integrated circuit device 20 (digital signal processing circuit 23) of the embodiment performs the neural network calculation that outputs the temperature estimation value based on the temperature detection data TD.

Figure 21:
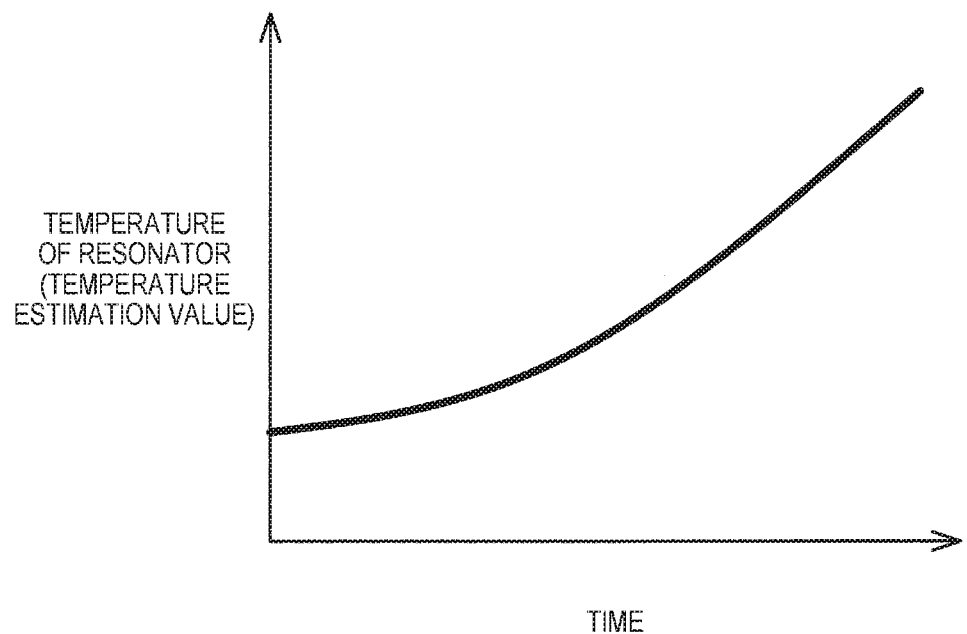
FIG. 21 is an example of change in time of a temperature estimation value estimated from actual measurement data and the heat conduction model.

The data in FIG. 15 that is actually measured in the inspection step (the temperature sweep of the constant temperature chamber) may be used as the temperature detection data TD used in the circuit simulation process. By the circuit simulation process using the change in time of each temperature detection data TD in FIG. 15 and the heat conduction model illustrated in FIG. 20, a change in time of the temperature estimation value is obtained as illustrated in FIG. 21. The learning process of the neural network is performed using the input data Xin obtained based on FIG. 15 and the temperature estimation value illustrated in FIG. 21 as training data. In the neural network after learning, calculation of outputting the temperature estimation value can be performed by inputting the input data Xin.

4.2 First Configuration Example of Neural Network

Figure 22:
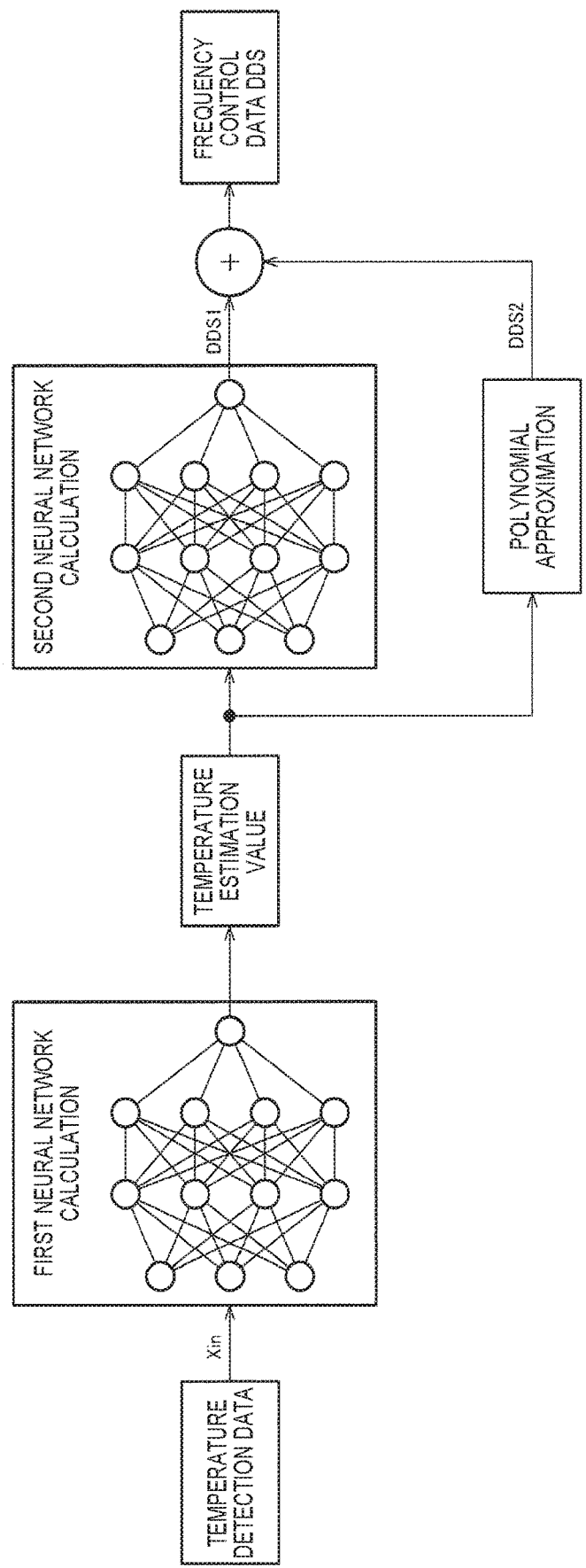
FIG. 22 is another diagram for describing the temperature compensation process of the embodiment.

FIG. 22 is a schematic diagram for describing the flow of temperature compensation process in the embodiment. The digital signal processing circuit 23 obtains the temperature estimation value of the resonator 10 by the neural network calculation process based on the first to N-th temperature detection data TD1 to TDN and performs the temperature compensation calculation based on polynomial approximation using the obtained temperature estimation value.

By obtaining the temperature estimation value of the resonator 10 by the neural network calculation, a decrease in accuracy caused by a difference between the temperature detection data TD and the temperature of the resonator 10 can be reduced.

Specifically, as illustrated in FIG. 22, the digital signal processing circuit 23 obtains the temperature estimation value by performing a first neural network calculation process based on the first to N-th temperature detection data TD1 to TDN, obtains the first frequency control data DDS1 by performing a second neural network calculation process based on the temperature estimation value, and obtains the second frequency control data DDS2 by performing the temperature compensation calculation based on polynomial approximation. The digital signal processing circuit 23 obtains the frequency control data DDS based on the first frequency control data DDS1 and the second frequency control data DDS2.

An inspection step (temperature sweep) for implementing the process in FIG. 22 is the same as that described above. That is, a change in time of each temperature detection data TD (FIG. 15) and a change in time of the frequency of the oscillation signal (FIG. 16) are actually measured, and a change in time of the input data Xin and a change in time of the frequency control data DDS are obtained based on the actual measurement data. Furthermore, a change in time of the temperature estimation value (FIG. 21) is obtained by the circuit simulation process based on the actual measurement data (FIG. 15).

First, the weight and the bias are determined by performing the learning process of a first neural network with the temperature estimation value corresponding to the input data Xin as training data. In the first neural network, the temperature of the resonator 10 needs to be accurately estimated. Thus, the input data Xin includes the amount of change in time of the temperature detection data TD. More specifically, the input data Xin of the first neural network desirably includes information from the plurality of temperature sensors 26.

Next, the relationship between the temperature estimation value and the frequency control data DDS is subjected to polynomial approximation using the least squares method, and the coefficient of the polynomial is determined. After the coefficient of the polynomial is obtained, the frequency control data (second frequency control data DDS2) based on the polynomial approximation is obtained using the temperature detection data and the polynomial.

The difference between the frequency control data DDS and the second frequency control data DDS2 based on the polynomial approximation is the training data of the first frequency control data DDS1 to be output by a second neural network. Thus, the weight and the bias are determined by performing the learning process of the second neural network with the difference correlated with the temperature estimation value as training data. While the input data of the second neural network may be the temperature estimation value, the repeatedly multiplied temperature estimation value may be added to the input data in order to improve accuracy by increasing the types of input.

The storage unit 24 of the integrated circuit device 20 stores the coefficient of the polynomial, the weight and the bias of the first neural network, and the weight and the bias of the second neural network as the parameters of the temperature compensation process.

Figure 23:
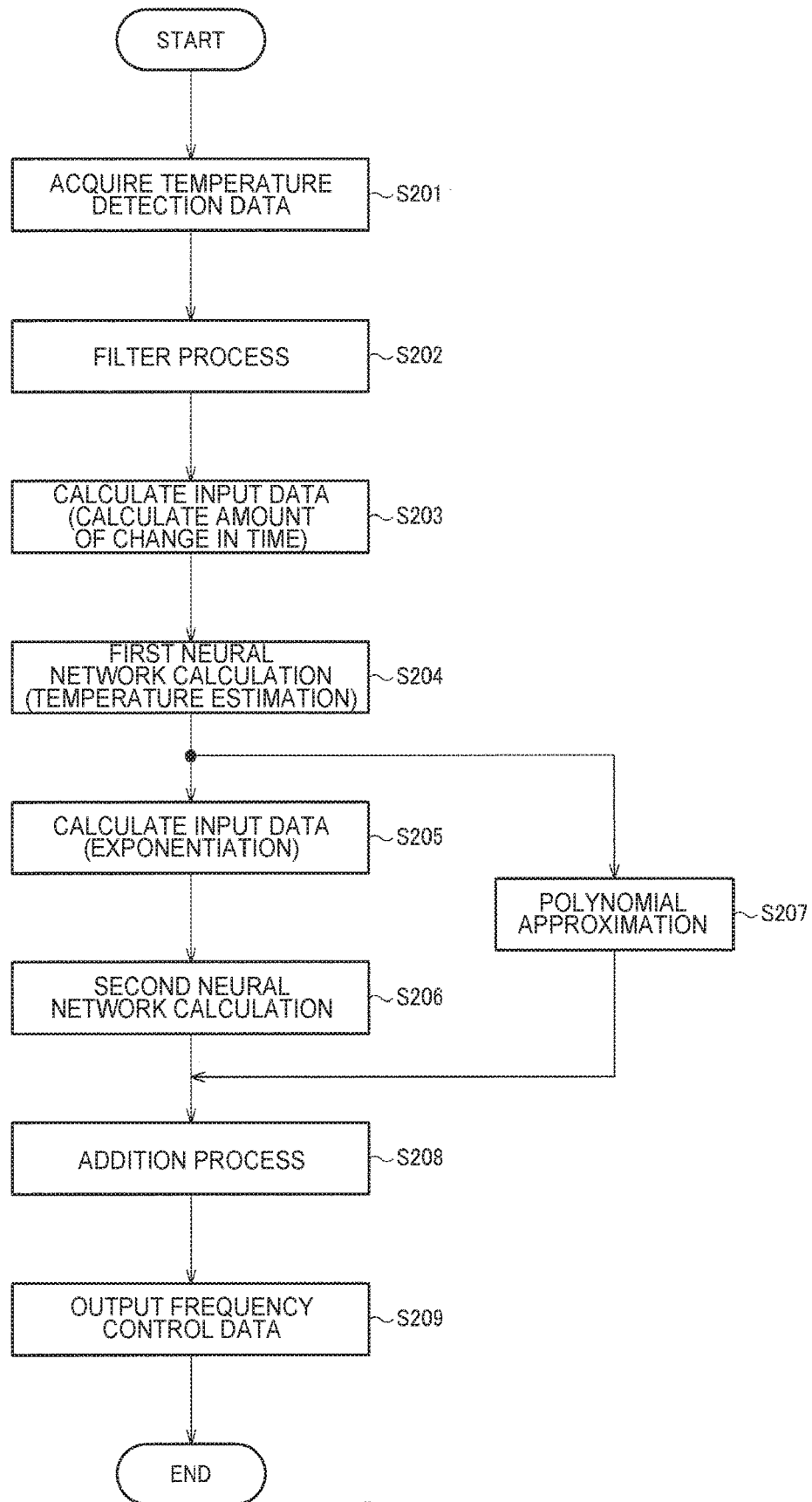
FIG. 23 is another flowchart for describing the temperature compensation process.

FIG. 23 is a flowchart for describing the temperature compensation process corresponding to FIG. 22. Processes of S201 and S202 are the same as S101 and S102 in FIG. 18.

Next, the digital signal processing circuit 23 performs a process of obtaining the input data Xin of the first neural network calculation (S203). In S203, it is desirable that data that includes the amount of change in time of the temperature detection data TD is calculated as the input data Xin. The first neural network calculation is performed in accordance with the input data Xin obtained in S203 and the weight and the bias acquired by the learning process, and the temperature estimation value is obtained (S204).

Next, the digital signal processing circuit 23 performs a process of obtaining the first frequency control data DDS1 by the second neural network calculation, and a process of obtaining the second frequency control data DDS2 by polynomial approximation. In the same manner as the example in FIG. 18, the order of the second neural network calculation and the polynomial approximation is not limited. Any of the second neural network calculation or the polynomial approximation may be performed first, or the second neural network calculation and the polynomial approximation may be executed in parallel.

In the second neural network calculation, a process of obtaining the input data based on the temperature estimation value is performed (S205). As described above, this process is calculation of repeated multiplication of the temperature estimation value. The second neural network calculation is performed with the calculated input data as input in accordance with the weight and the bias acquired by the learning process (S206). In the neural network, the number of neurons in the output layer is one, and the first frequency control data DDS1 is output.

In addition, the digital signal processing circuit performs polynomial approximation that takes the temperature estimation value obtained in S204 as the input (variable) of the polynomial, and obtains the second frequency control data DDS2 (S207).

A process of adding the first frequency control data DDS1 obtained in S206 and the second frequency control data DDS2 obtained in S207 is performed (S208), and the result of addition is output as the frequency control data DDS to the oscillation signal generation circuit 40 (S209).

4.3 Second Configuration Example of Neural Network

FIG. 22 illustrates an example in which the neural network is divided into the first neural network for obtaining the temperature estimation value and the second neural network for obtaining the first frequency control data. However, the configuration of the neural network is not limited to such an example.

Figure 24:
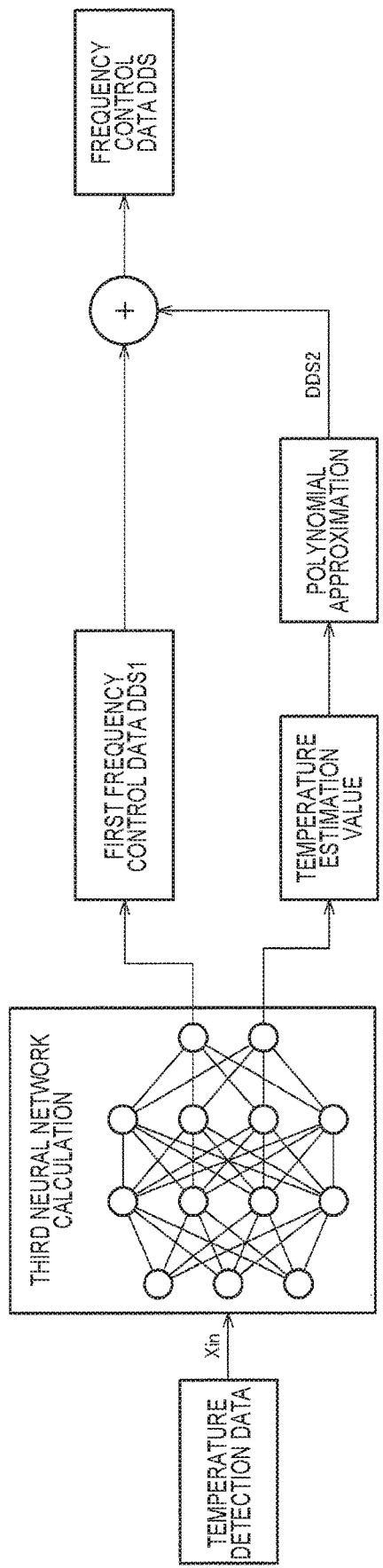
FIG. 24 is another diagram for describing the temperature compensation process of the embodiment.

FIG. 24 is another schematic diagram for describing the flow of temperature compensation process. As illustrated in FIG. 24, the digital signal processing circuit 23 obtains the temperature estimation value and the first frequency control data DDS1 by a third neural network calculation process based on the first to N-th temperature detection data TD1 to TDN, and obtains the second frequency control data DDS2 by the temperature compensation calculation based on polynomial approximation. The digital signal processing circuit 23 obtains the frequency control data DDS based on the first frequency control data DDS1 and the second frequency control data DDS2.

An inspection step for implementing the process in FIG. 24 is the same as the example in FIG. 22. That is, a change in time of each temperature detection data TD (FIG. 15) and a change in time of the frequency of the oscillation signal (FIG. 16) are actually measured, and a change in time of the input data Xin and a change in time of the frequency control data DDS are obtained based on the actual measurement data. Furthermore, a change in time of the temperature estimation value (FIG. 21) is obtained by the circuit simulation process based on the actual measurement data (FIG. 15).

First, the relationship between the temperature estimation value and the frequency control data DDS is subjected to polynomial approximation using the least squares method, and the coefficient of the polynomial is determined. After the coefficient of the polynomial is obtained, the frequency control data (second frequency control data DDS2) based on the polynomial approximation is obtained using the temperature estimation value and the polynomial.

The difference between the frequency control data DDS and the second frequency control data DDS2 based on the polynomial approximation is the training data of the first frequency control data DDS1 to be output by a third neural network. The third neural network is a neural network that performs both of the calculation of the first frequency control data DDS1 and the calculation of obtaining the temperature estimation value. Thus, the weight and the bias are determined by performing the learning process of the third neural network with both of the difference corresponding to the input data Xin and the temperature estimation value corresponding to the input data Xin as training data. In the third neural network, the temperature of the resonator 10 needs to be accurately estimated. Thus, the input data Xin includes the amount of change in time of the temperature detection data TD. More specifically, the input data Xin of the third neural network desirably includes information from the plurality of temperature sensors 26.

The storage unit 24 of the integrated circuit device 20 stores the coefficient of the polynomial and the weight and the bias of the third neural network as the parameters of the temperature compensation process.

Figure 25:
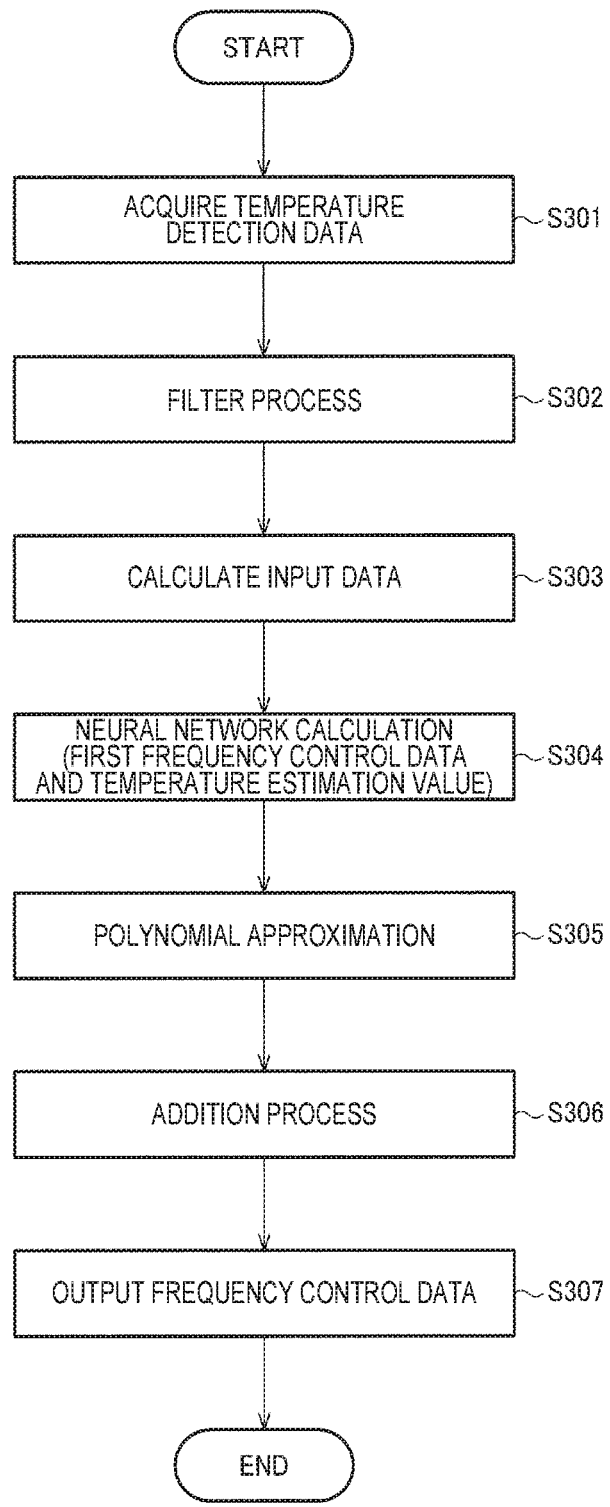
FIG. 25 is a flowchart for describing the temperature compensation process.

FIG. 25 is a flowchart for describing the temperature compensation process corresponding to FIG. 24. Processes of S301 and S302 are the same as S101 and S102 in FIG. 18.

Next, the digital signal processing circuit 23 performs a process of obtaining the input data Xin of the third neural network calculation (S303). The process of S303 is the same as S203 in FIG. 23. Data that includes the amount of change in time of the temperature detection data TD is calculated as the input data Xin.

The third neural network calculation is performed in accordance with the input data Xin obtained in S303 and the weight and the bias acquired by the learning process (S304). In the neural network, the number of neurons in the output layer is two, and the first frequency control data DDS1 and the temperature estimation value are output.

The digital signal processing circuit 23 performs polynomial approximation that takes the temperature estimation value obtained in S304 as the input (variable) of the polynomial, and obtains the second frequency control data DDS2 (S305).

A process of adding the first frequency control data DDS1 obtained in S304 and the second frequency control data DDS2 obtained in S305 is performed (S306), and the result of addition is output as the frequency control data DDS to the oscillation signal generation circuit 40 (S307).

5. Modification Examples

Hereinafter, several modification examples will be described.

5.1 Modification Example of Oscillation Signal Generation Circuit

Figure 26:
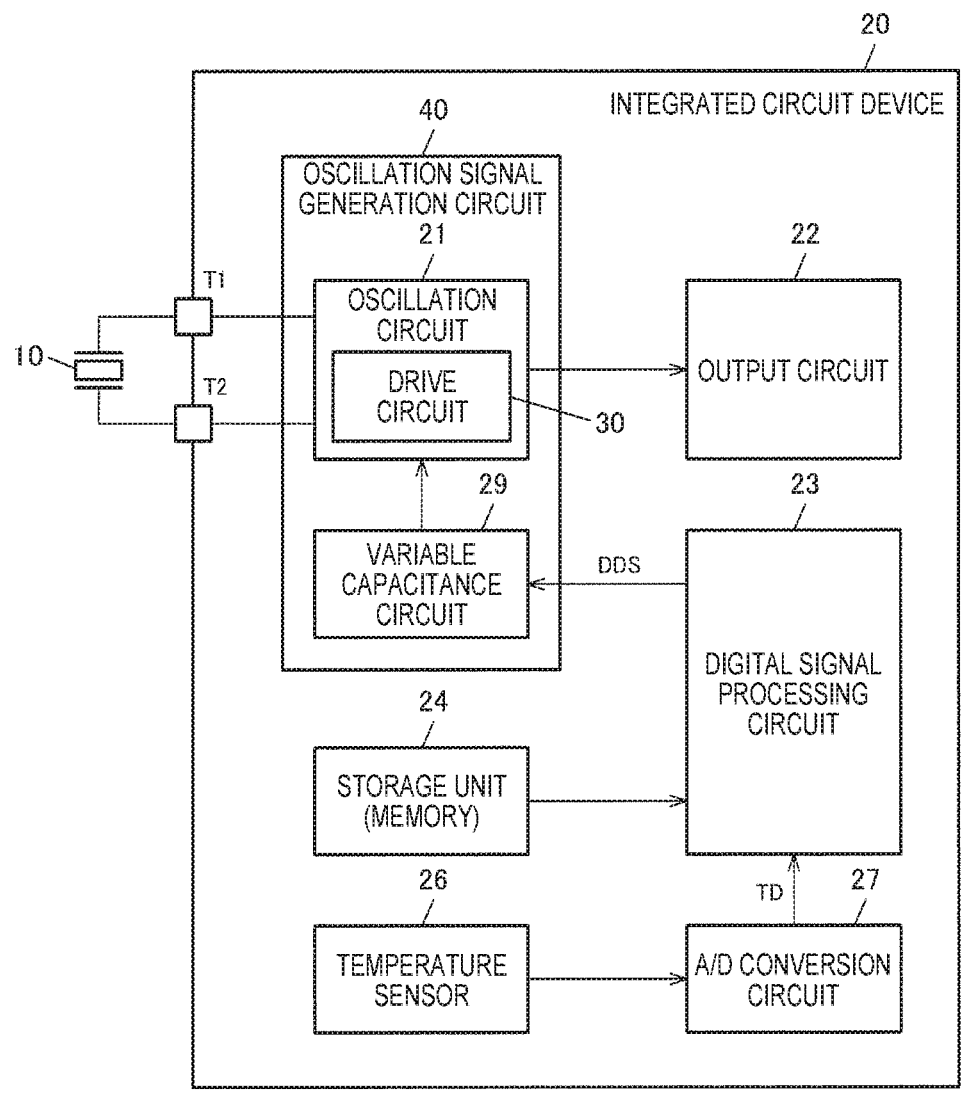
FIG. 26 is another configuration example of the integrated circuit device.

FIG. 26 illustrates another configuration example of the integrated circuit device 20. The oscillation signal generation circuit 40 of the integrated circuit device 20 in FIG. 26 includes a variable capacitance circuit 29 and the oscillation circuit 21. The D/A conversion circuit 25 is not disposed in the oscillation signal generation circuit 40. The oscillation frequency of the oscillation signal generated by the oscillation signal generation circuit 40 in FIG. 26 is directly controlled based on the frequency control data DDS from the digital signal processing circuit 23. That is, the oscillation frequency of the oscillation signal is controlled without the D/A conversion circuit 25.

The capacitance value of the variable capacitance circuit 29 is controlled based on the frequency control data DDS from the digital signal processing circuit 23. For example, the variable capacitance circuit 29 includes a plurality of capacitors (capacitor array) and a plurality of switch elements (switch array) in which switching ON and OFF of each switch element is controlled based on the frequency control data DDS. Each switch element of the plurality of switch elements is electrically connected to each capacitor of the plurality of capacitors. By switching the plurality of switch elements ON or OFF, the number of capacitors of which one end is connected to one end of the resonator 10 among the plurality of capacitors is changed. Accordingly, the capacitance value of the variable capacitance circuit 29 is controlled, and the capacitance value at one end of the resonator 10 is changed. Accordingly, the capacitance value of the variable capacitance circuit 29 is directly controlled using the frequency control data DDS, and the oscillation frequency of the oscillation signal can be controlled.

Figure 27:
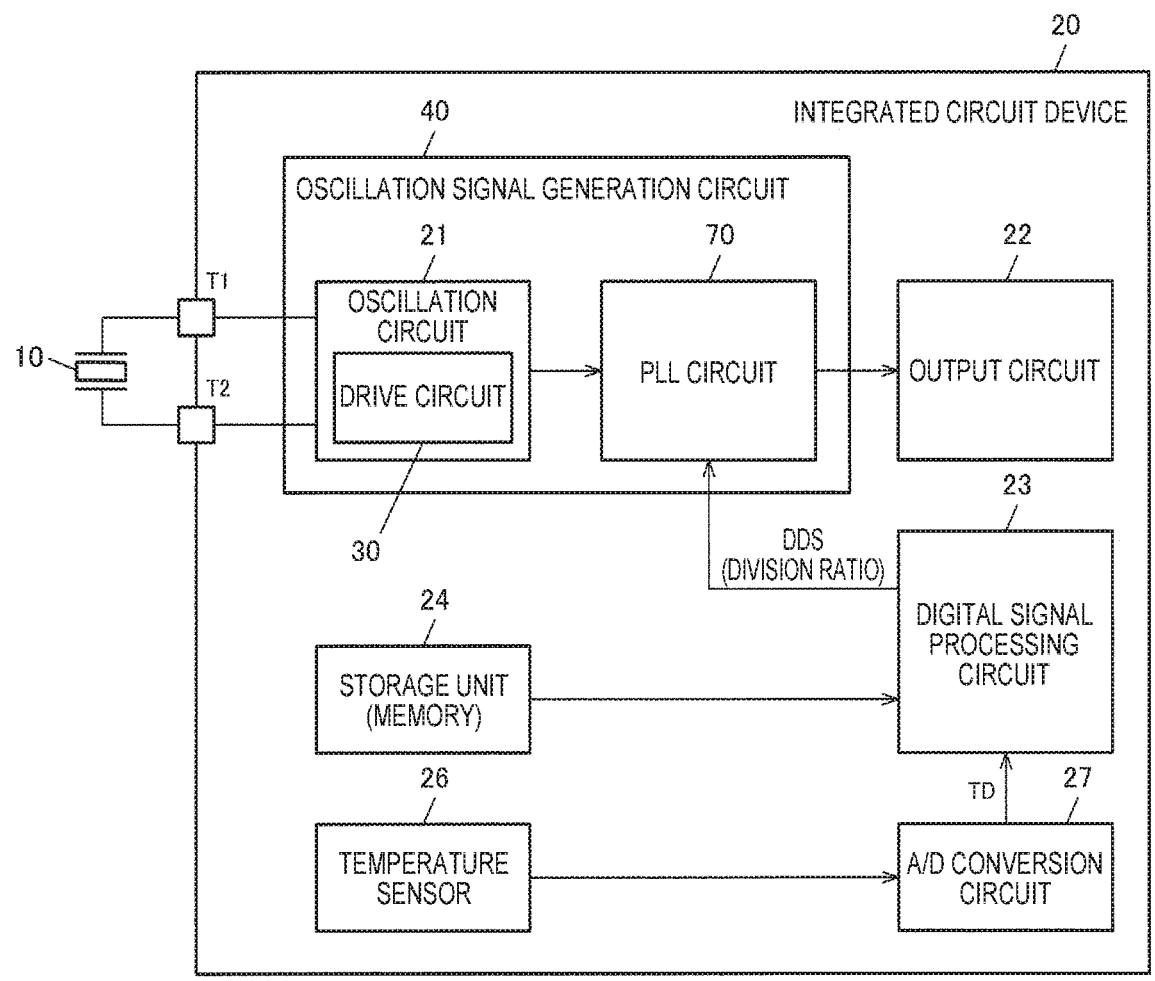
FIG. 27 is another configuration example of the integrated circuit device.

5.2 Modification Example of Controlling Oscillation Frequency Using PLL Circuit FIG. 27 illustrates another configuration example of the integrated circuit device 20. The oscillation signal generation circuit 40 of the integrated circuit device 20 in FIG. 27 includes a PLL circuit 70. The PLL circuit 70 is specifically a fractional-N type PLL circuit.

Figure 28:
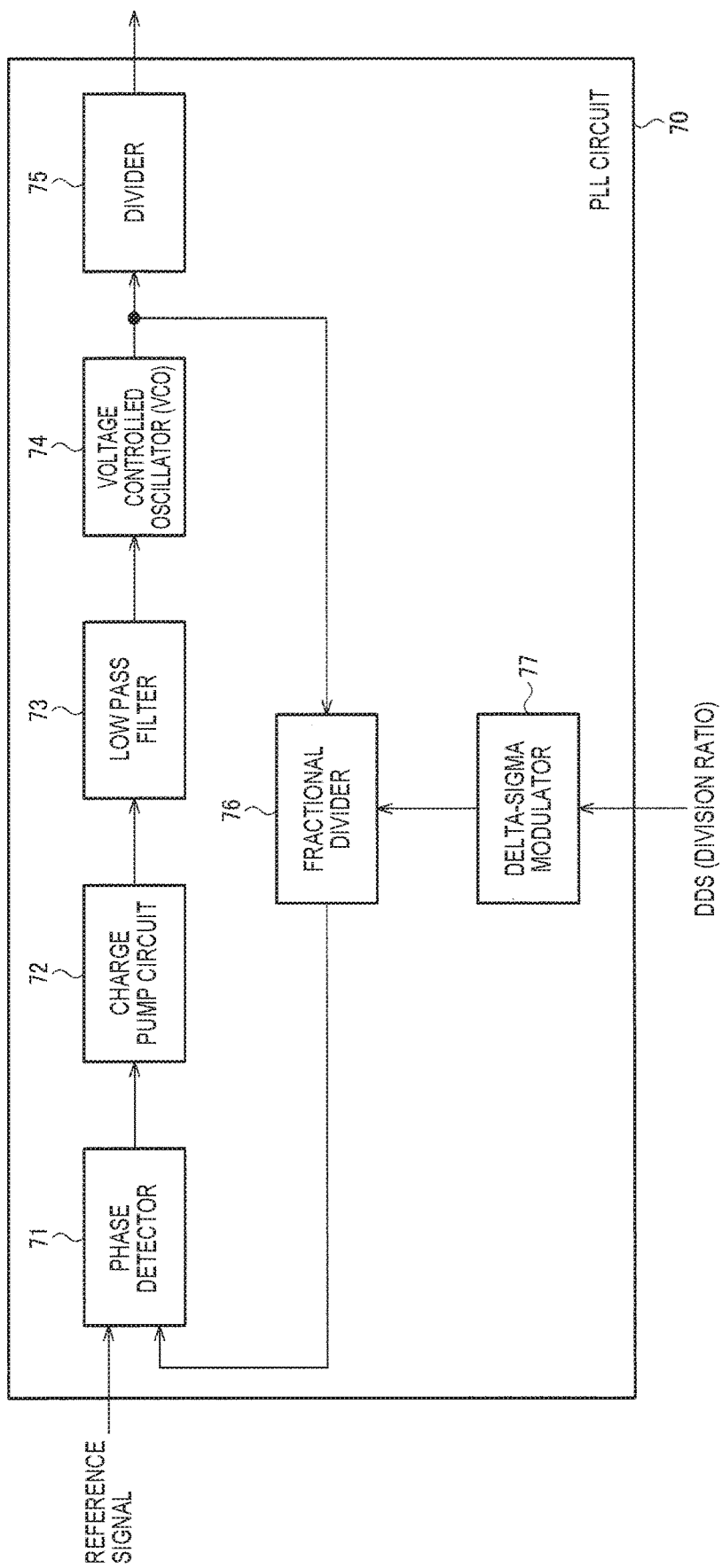
FIG. 28 is a configuration example of a PLL circuit.

FIG. 28 is a configuration example of the PLL circuit 70. The PLL circuit 70 includes a phase detector (phase comparator) 71, a charge pump circuit 72, a low pass filter 73, a voltage controlled oscillator 74 (VCO), a divider 75, a fractional divider 76, and a delta-sigma modulator 77.

The phase detector 71 compares the phase of a PLL oscillation signal fed back through the fractional divider 76 with the phase of a signal from the oscillation circuit 21 and outputs a voltage signal based on the difference in phase. The charge pump circuit 72 converts the voltage signal from the phase detector 71 into a current signal. The low pass filter 73 converts the current signal from the charge pump circuit 72 into a voltage signal and performs a low pass filter process on the voltage signal. The voltage controlled oscillator 74 oscillates at a frequency corresponding to the voltage value from the low pass filter 73. The fractional divider 76 and the delta-sigma modulator divide the PLL oscillation signal from the voltage controlled oscillator 74 at a division ratio of a fractional number (integer+fraction). The signal from the oscillation circuit 21 can be subjected to fractional multiplication by the fractional division.

For example, the division ratio of the fractional number is acquired as follows. Data for setting the division ratio is input into the delta-sigma modulator 77 as the frequency control data DSS from the digital signal processing circuit 23. The delta-sigma modulator 77 generates a switching signal by delta-sigma modulation such that the average value of the switching signal is a desired fractional number represented by the frequency control data DDS, and switches a plurality of integer division ratios using the switching signal. For example, in a case where P division and P+1 division are switched at 1:1, an average fractional division ratio of P+0.5 is acquired.

The divider 75 divides the PLL oscillation signal from the voltage controlled oscillator 74 and outputs the divided signal to the output circuit 22.

As described above, in the example in FIG. 27, the frequency control data DSS output by the digital signal processing circuit 23 is data that determines the division ratio of the PLL circuit 70. In other words, the digital signal processing circuit 23 can control the oscillation frequency of the oscillation signal using the PLL circuit by outputting an appropriate division ratio as the frequency control data DDS.

5.3 Modification Example of Inspection Step

A method of measuring the oscillation frequency in the inspection step (FIG. 16), measuring the temperature characteristics of the varactor (FIG. 2), and obtaining a change in time of the frequency control data DDS based on the oscillation frequency and the temperature characteristics is described above. A method of obtaining the frequency control data DDS is not limited to such a method. A fractional PLL circuit may be used in the inspection step. This fractional PLL circuit may be an inspection PLL circuit disposed in an inspection device or may be the PLL circuit 70 included in the integrated circuit device 20 having the configuration in FIG. 27.

Specifically, in the inspection step, a reference clock is input from the outside, and the oscillation frequency of the resonator 10 is locked at a frequency based on the reference clock by the fractional PLL circuit. In such a state, the frequency control data DDS output from the digital signal processing circuit 23 has a value that causes an oscillation signal of a desired frequency to be output. That is, by using the fractional PLL circuit, the frequency control data DDS can be actually measured directly without measuring the temperature characteristics of the varactor (FIG. 2).

In addition, as described above, in order to improve the accuracy of the neural network, it is desirable to use various training data, and measurement may be performed by a plurality of temperature sweeps. However, as is understood from the example in FIG. 4, one temperature sweep requires a certain amount of time. Thus, the amount of time required for measuring data is increased.

Thus, learning data may be generated by virtually performing the temperature sweep without actually measuring data by actually performing the temperature sweep. First, in the initial temperature sweep, the constant temperature chamber is actually controlled, and the temperature detection data TD and the oscillation frequency are actually measured (FIG. 15 and FIG. 16). The temperature estimation value is calculated based on the actually measured temperature detection data TD and the heat conduction model, and the relationship between the temperature estimation value and the frequency is obtained based on the calculation result (FIG. 21) and the actual measurement data (FIG. 16). The relationship between the temperature estimation value and the frequency is the temperature characteristics of the resonator 10.

In addition, in the heat conduction model, temperature fluctuation of the resonator 10 in a case where the outside temperature (the temperature of the constant temperature chamber) fluctuates can be estimated. For example, a voltage source in the heat circuit in FIG. 20 may be considered as the temperature of the constant temperature chamber, or a node (and necessary heat resistances and heat capacitances) corresponding to the constant temperature chamber may be added to FIG. 20. By using the heat conduction model, a change in time of the temperature of the resonator 10 (the electric potential of C7 or C8) with respect to any virtual temperature sweep can be obtained. A change in time of the oscillation frequency can be estimated based on a change in time of the temperature of the resonator 10 and the temperature characteristics of the resonator 10 obtained in the initial temperature sweep.

That is, once the temperature characteristics of the resonator 10 are estimated, data (data corresponding to FIG. 15 or FIG. 16) in a case where any temperature sweep is performed can be estimated afterward without actually executing the temperature sweep. Then, various learning data can be acquired in a small amount of time, and a high accuracy neural network calculation can be easily implemented.

6. Electronic Device and Vehicle

Figure 29:
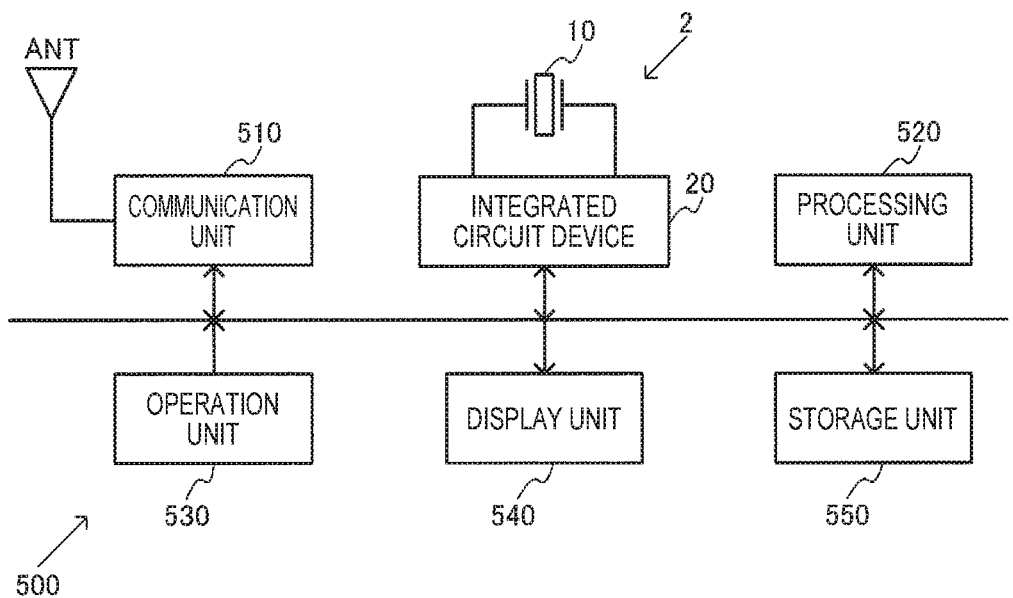
FIG. 29 is a configuration example of an electronic device.

FIG. 29 illustrates a configuration example of an electronic device 500 that includes the resonator device 2 (integrated circuit device 20) of the embodiment. The electronic device 500 includes the resonator device 2 including the integrated circuit device 20 and the resonator 10, and a processing unit 520. In addition, a communication unit 510, an operation unit 530, a display unit 540, a storage unit 550, and an antenna ANT can be included.

It can be assumed that the electronic device 500 is, for example, a network-related device such as a base station or a router, a high accuracy measurement device that measures a physical quantity such as a distance, a time, a flow speed, or a flow rate, a biometric information measurement device (an ultrasonic measurement device, a pulse wave meter, a blood pressure measurement device, or the like) that measures biometric information, or a vehicle-mounted device (a device or the like for automatic driving). In addition, it can be assumed that the electronic device 500 is a wearable device such as a head mounted type display device or a timepiece-related device, a robot, a printing device, a projection device, a portable information terminal (smartphone or the like) a contents providing device that distributes contents, or a video device such as a digital camera or a video camera.

The communication unit 510 (communication interface) performs a process of receiving data from the outside or transmitting data to the outside through the antenna ANT. The processing unit 520 (processor) performs a control process for the electronic device 500 and various digital processes and the like for the data transmitted and received through the communication unit 510. The function of the processing unit 520 can be implemented by a processor such as a microcomputer. The operation unit 530 (operation interface) is used for a user to perform an input operation and can be implemented by an operation button, a touch panel display, or the like. The display unit 540 displays various information and can be implemented by, for example, a liquid crystal or an organic EL display. The storage unit 550 stores data. The function of the storage unit 550 can be implemented by a semiconductor memory such as RAM or ROM, a hard disk drive (HDD), or the like.

Figure 30:
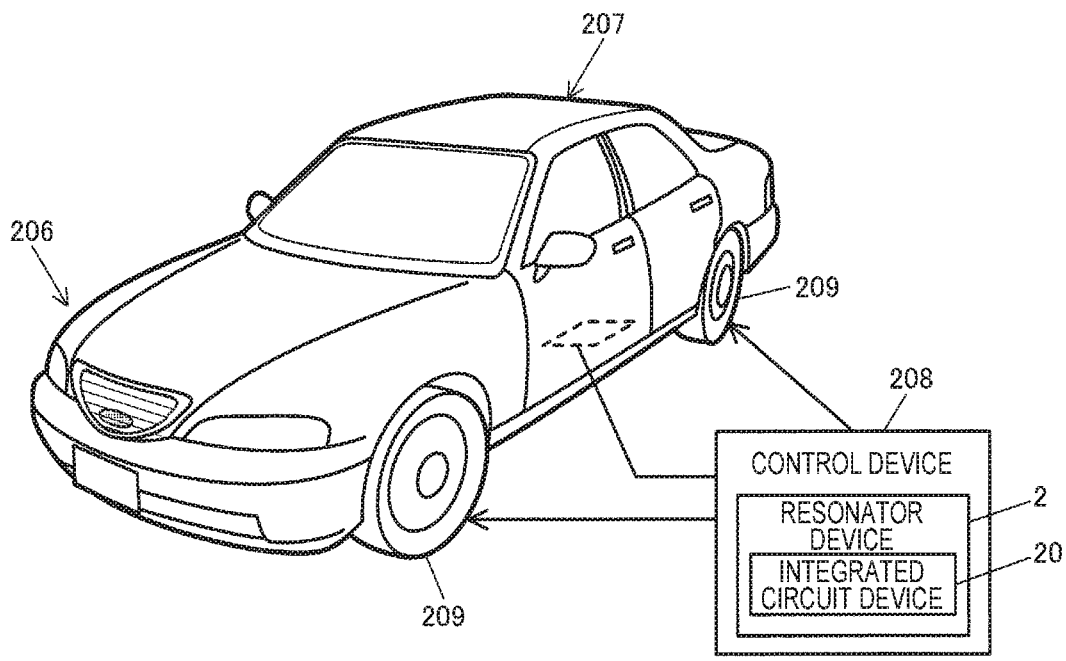
FIG. 30 is a configuration example of a vehicle.

FIG. 30 illustrates an example of a vehicle that includes the resonator device 2 (integrated circuit device 20) of the embodiment. The resonator device 2 (an oscillator or a physical quantity measurement device) of the embodiment can be embedded in various vehicles such as a car, an airplane, a motorcycle, a bicycle, a robot, and a ship. The vehicle is a device or an apparatus that includes a drive mechanism such as an engine or a motor, a steering mechanism such as a steering wheel or a rudder, and various electronic devices (vehicle-mounted devices) and moves on the ground, in the air, or on the sea. FIG. 30 schematically illustrates an automobile 206 as a specific example of the vehicle. The resonator device 2 of the embodiment is embedded in the automobile 206. A control device 208 performs various control processes based on the clock signal generated by the resonator device 2 or physical quantity information measured by the resonator device 2. For example, in a case where distance information related to an object around the automobile 206 is measured as the physical quantity information, the control device 208 performs various control processes for automatic driving using the measured distance information. For example, the control device 208 controls the firmness of suspension or controls brakes of individual wheels 209 depending on the attitude of a vehicle body 207. A device in which the resonator device 2 of the embodiment is embedded is not limited to the control device 208. The resonator device 2 can be embedded in various devices disposed in the vehicle such as the automobile 206 or a robot.

While the embodiment is described in detail above, it can be easily perceived by those skilled in the art that many modifications can be made without substantially departing from the novel matters and effects of the invention. Accordingly, all of such modification examples fall within the scope of the invention. For example, a term that is used at least once along with a different term having a wider sense or the same sense in the specification or the drawings can be replaced with the different term at any location in the specification or the drawings. In addition, all combinations of the embodiment and the modification examples fall within the scope of the invention. In addition, the configuration and operation of the resonator device, the circuit device, the electronic device, and the vehicle and the arrangement configuration, the connection configuration, and the like of the resonator, the relay substrate, and the circuit device in the resonator device are not limited to those described in the embodiment, and various modifications can be made.

The entire disclosure of Japanese Patent Application No. 2018-011418, filed Jan. 26, 2018 is expressly incorporated by reference herein.

What is claimed is:

1. An integrated circuit device, comprising:
  a digital signal processing circuit that generates frequency control data by performing a temperature compensation process using a neural network calculation process based on temperature detection data and an amount of change in time of the temperature detection data;
  an oscillation signal generation circuit that generates an oscillation signal of a frequency set by the frequency control data using a resonator;
  a drive circuit that drives the resonator;
  a first oscillation terminal coupled to one of an input node or an output node of the drive circuit;
  a second oscillation terminal coupled to the other of the input node or the output node of the drive circuit;
  a power supply terminal where a power supply voltage is supplied;
  an output terminal from which the oscillation signal is output; and a first temperature sensor that generates the temperature detection data,
  wherein a distance between the first temperature sensor and the first oscillation terminal is smaller than at least one of a distance between the first temperature sensor and the power supply terminal or a distance between the first temperature sensor and the output terminal.

2. The integrated circuit device according to claim 1, further comprising:
a second temperature sensor,
  wherein a distance between the second temperature sensor and the second oscillation terminal is smaller than at least one of a distance between the second temperature sensor and the power supply terminal or a distance between the second temperature sensor and the output terminal.

3. The integrated circuit device according to claim 1, further comprising:
a third temperature sensor; and
a support terminal in which an electrode for supporting the resonator is disposed,
  wherein a distance between the third temperature sensor and the support terminal is smaller than at least one of a distance between the third temperature sensor and the power supply terminal or a distance between the third temperature sensor and the output terminal.

4. The integrated circuit device according to claim 1, further comprising:
a third temperature sensor; and
a support terminal in which an electrode for supporting a relay substrate on which the resonator is mounted is disposed,
  wherein a distance between the third temperature sensor and the support terminal is smaller than at least one of a distance between the third temperature sensor and the power supply terminal or a distance between the third temperature sensor and the output terminal.

5. The integrated circuit device according to claim 1, wherein the digital signal processing circuit performs the temperature compensation process based on a result of temperature compensation calculation using polynomial approximation and a result of the neural network calculation process.

6. The integrated circuit device according to claim 5, wherein the digital signal processing circuit obtains a temperature estimation value of the resonator by the neural network calculation process and performs the temperature compensation calculation based on the polynomial approximation using the obtained temperature estimation value.

7. The integrated circuit device according to claim 6, wherein the digital signal processing circuit
  obtains the temperature estimation value by a first neural network calculation process based on the temperature detection data and the amount of change in time,
  obtains first frequency control data by a second neural network calculation process based on the temperature estimation value,
  obtains second frequency control data by the temperature compensation calculation based on the polynomial approximation, and
  obtains the frequency control data based on the first frequency control data and the second frequency control data.

8. The integrated circuit device according to claim 6, wherein the digital signal processing circuit
  obtains the temperature estimation value and first frequency control data by third neural network calculation based on the temperature detection data and the amount of change in time,
  obtains second frequency control data by the temperature compensation calculation based on the polynomial approximation, and
  obtains the frequency control data based on the first frequency control data and the second frequency control data.

9. An electronic device comprising:
the integrated circuit device according to claim 1.

10. A vehicle comprising:
the integrated circuit device according to claim 1.

11. An oscillator comprising:
a resonator; and
an integrated circuit device including:
  a digital signal processing circuit that generates frequency control data by performing a temperature compensation process using a neural network calculation process based on temperature detection data and an amount of change in time of the temperature detection data;
  an oscillation signal generation circuit that generates an oscillation signal of a frequency set by the frequency control data using the resonator;
a drive circuit that drives the resonator;
a first oscillation terminal coupled to one of an input node or an output node of the drive circuit;
a second oscillation terminal coupled to the other of the input node or the output node of the drive circuit;
a power supply terminal where a power supply voltage is supplied;
an output terminal from which the oscillation signal is output; and
a first temperature sensor that generates the temperature detection data,
  wherein a distance between the first temperature sensor and the first oscillation terminal is smaller than at least one of a distance between the first temperature sensor and the power supply terminal or a distance between the first temperature sensor and the output terminal.

12. An integrated circuit device comprising:
first to N-th (N is an integer greater than or equal to two) temperature sensors;
an A/D conversion circuit that performs A/D conversion on first to N-th temperature detection voltages from the first to N-th temperature sensors and outputs first to N-th temperature detection data;
a digital signal processing circuit that generates frequency control data by performing a temperature compensation process by a neural network calculation process based on an amount of change in time of i-th (i is an integer satisfying 1≤i≤N) temperature detection data of the first to N-th temperature detection data;
an oscillation signal generation circuit that generates an oscillation signal of an oscillation frequency corresponding to the frequency control data using a resonator;
a drive circuit that drives the resonator;
a first oscillation terminal coupled to one of an input node or an output node of the drive circuit;
a second oscillation terminal coupled to the other of the input node or the output node of the drive circuit;
a power supply terminal where a power supply voltage is supplied;

an output terminal from which the oscillation signal is output; and a first temperature sensor that generates the temperature detection data, wherein a distance between the first temperature sensor and the first oscillation terminal is smaller than at least one of a distance between the first temperature sensor and the power supply terminal or a distance between the first temperature sensor and the output terminal.

* * * * *